(12) United States Patent
Fukuchi

(10) Patent No.: US 12,495,529 B2
(45) Date of Patent: Dec. 9, 2025

(54) POWER CONVERSION DEVICE AND DC-DC CONVERTER DEVICE

(71) Applicant: FUJI ELECTRIC CO., LTD., Kawasaki (JP)

(72) Inventor: Shun Fukuchi, Suzuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 115 days.

(21) Appl. No.: 18/100,215

(22) Filed: Jan. 23, 2023

(65) Prior Publication Data
US 2023/0292474 A1    Sep. 14, 2023

(30) Foreign Application Priority Data

Mar. 8, 2022 (JP) ................................. 2022-035624

(51) Int. Cl.
| | |
|---|---|
| H05K 7/20 | (2006.01) |
| H02M 3/00 | (2006.01) |
| H02M 3/335 | (2006.01) |
| H02M 7/00 | (2006.01) |
| H02M 7/537 | (2006.01) |

(52) U.S. Cl.
CPC ........ *H05K 7/20927* (2013.01); *H02M 3/003* (2021.05); *H02M 3/335* (2013.01); *H02M 7/003* (2013.01); *H02M 7/537* (2013.01); *H05K 7/20145* (2013.01)

(58) Field of Classification Search
None
See application file for complete search history.

(56) References Cited

U.S. PATENT DOCUMENTS

| | | | | |
|---|---|---|---|---|
| 9,578,790 | B2 * | 2/2017 | Kodama | ............. B60L 3/003 |
| 2014/0321065 | A1 * | 10/2014 | Nishimura | ........ H02M 3/33571 361/722 |
| 2015/0036388 | A1 * | 2/2015 | Handa | .............. H02M 3/28 363/15 |
| 2015/0357923 | A1 | 12/2015 | Nakazawa et al. | |
| 2021/0344283 | A1 * | 11/2021 | Zhou | ............. H02M 3/1582 |

FOREIGN PATENT DOCUMENTS

| | | |
|---|---|---|
| CN | 103947094 A | 7/2014 |
| JP | 2014-090523 A | 5/2014 |
| JP | 2014-131394 A | 7/2014 |
| JP | 2019-161797 A | 9/2019 |

OTHER PUBLICATIONS

Japan Patent Office, "Office Action for Japanese Patent Application 2022-035624," Jun. 21, 2022.
China Patent Office, The First Office Action for Chinese Patent Application No. 202310048235.7 dated Sep. 10, 2025; 16 pp.

* cited by examiner

*Primary Examiner* — Courtney L Smith
(74) *Attorney, Agent, or Firm* — HAUPTMAN HAM, LLP

(57) ABSTRACT

The power conversion device includes: a DC-DC converter unit including a transformer having a coil substrate where a primary side coil is formed and a bus bar forming a secondary side coil, and converting a voltage of DC power input from a DC power supply into a different voltage; and a cooling portion where a cooling flow path through which a cooling liquid flows is provided and the DC-DC converter unit is disposed. The bus bar of the transformer has a cooling portion side fixed portion fixed to the cooling portion provided with the cooling flow path.

14 Claims, 11 Drawing Sheets

FIG. 6
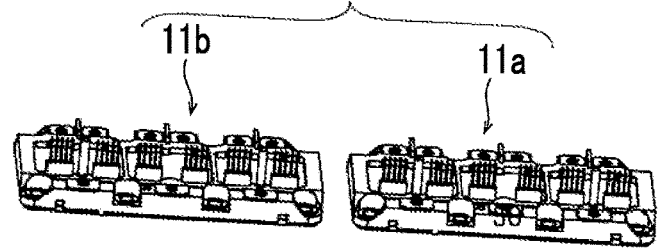
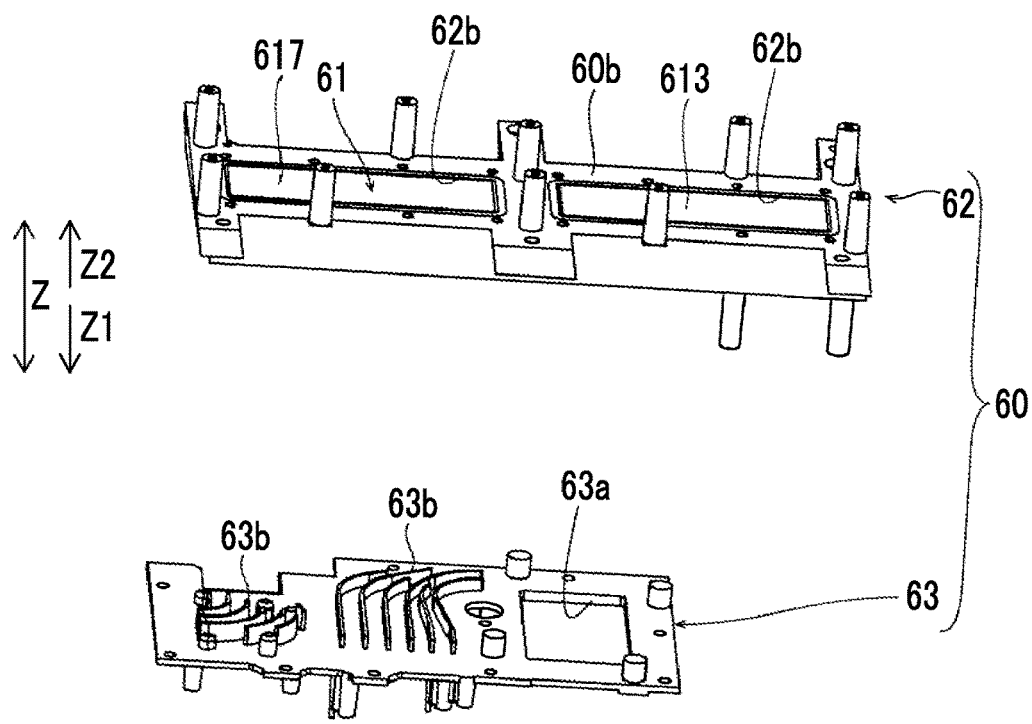
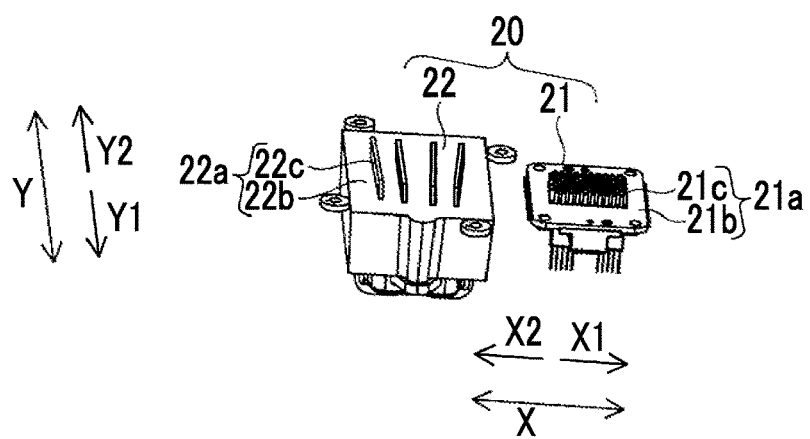

POWER CONVERSION DEVICE AND DC-DC CONVERTER DEVICE

CROSS-REFERENCE TO RELATED APPLICATION

The present application is based on and claims priority of Japanese Patent Application No. 2022-035624, power conversion device and DC-DC converter device, filed on Mar. 8, 2022, the disclosure of which is hereby incorporated by reference.

BACKGROUND OF THE INVENTION

Field of the Invention

This invention relates to a power conversion device and a DC-DC converter device, and more particularly to a power conversion device including a transformer and a DC-DC converter device.

Background Art

A power conversion device including a transformer is known in the related art. Such a device is disclosed in, for example, Japanese Unexamined Patent Publication No. 2014-90523.

Japanese Unexamined Patent Publication No. 2014-90523 discloses a power conversion device including a transformer constituting a DCDC converter (DC-DC converter). This power conversion device includes a housing storing the transformer, and the transformer including a printed board having a primary side coil conductor and a bus bar as a secondary side coil conductor having a plate shape. Further, heat generated from the transformer is dissipated to the housing by fixing the bus bar, which is the secondary side coil conductor of the transformer, to the housing in a state of being pressed.

However, even in the power conversion device of the related art as described in Japanese Unexamined Patent Publication No. 2014-90523, it may be impossible to sufficiently dissipate the heat generated from the transformer in a case where, for example, a large amount of current is passed through the transformer constituting the DC-DC converter. Therefore, there is a demand for a power conversion device and a DC-DC converter device capable of sufficiently dissipating heat generated in a transformer from a bus bar of the transformer.

SUMMARY OF THE INVENTION

This invention has been made to solve the above problem, and one object of this invention is to provide a power conversion device and a DC-DC converter device capable of sufficiently dissipating heat generated in a transformer from a bus bar of the transformer.

In order to achieve the above object, a power conversion device according to a first aspect of this invention includes: a DC-DC converter unit including a transformer having a coil substrate where a primary side coil is formed and a bus bar forming a secondary side coil, and converting a voltage of DC power input from a DC power supply into a different voltage; and a cooling portion where a cooling flow path through which a cooling liquid flows is provided and the DC-DC converter unit is disposed, in which the bus bar of the transformer has a cooling portion side fixed portion fixed to the cooling portion provided with the cooling flow path.

In the power conversion device according to the first aspect, as described above, by fixing the cooling portion side fixed portion of the bus bar of the transformer to the cooling portion provided with the cooling flow path, the heat generated in the transformer can be transferred from the cooling portion side fixed portion to the cooling liquid flowing through the cooling flow path via the cooling portion provided with the cooling flow path. As a result, the heat generated in the transformer can be efficiently dissipated by the cooling liquid flowing through the cooling flow path to cool the transformer. As a result, it is possible to provide the power conversion device capable of sufficiently dissipating the heat generated in the transformer from the bus bar of the transformer.

In the power conversion device according to the first aspect, preferably, the cooling portion side fixed portion of the bus bar is disposed so as to overlap the cooling flow path provided in the cooling portion when viewed from a direction in which the bus bar and the cooling portion face each other. With this configuration, the distance between the cooling portion side fixed portion of the bus bar and the cooling flow path is shorter than a case where the cooling portion side fixed portion of the bus bar does not overlap the cooling flow path, and thus heat dissipation from the bus bar (cooling of the transformer) can be performed more efficiently. As a result, the heat generated in the transformer can be more sufficiently dissipated from the bus bar of the transformer.

In the power conversion device according to the first aspect, preferably, the cooling portion includes a main body member where the cooling flow path is formed and a cover member attached to the main body member, and the cooling portion side fixed portion of the bus bar is fixed to the cover member of the cooling portion. With this configuration, the heat generated in the transformer can be transferred to the cooling liquid flowing through the cooling flow path via the cover member of the cooling portion to which the cooling portion side fixed portion of the bus bar is fixed. As a result, the heat generated in the transformer can be efficiently dissipated to the cooling liquid flowing through the cooling flow path via the cover member of the cooling portion.

In this case, preferably, the power conversion device further includes a main circuit board to which the bus bar of the transformer is connected and that is disposed so as to face the cooling portion, in which the cover member of the cooling portion has a protrusion portion protruding to the main circuit board side, the main circuit board is provided with an opening portion for exposing the protrusion portion of the cover member, and the cooling portion side fixed portion of the bus bar is fixed to the protrusion portion of the cover member. With this configuration, the cooling portion side fixed portion of the bus bar is fixed to the protrusion portion of the cover member provided on the cover member of the cooling portion and protruding to the main circuit board side, and thus the distance between the transformer and the cover member is shorter than a case where the cover member does not have the protrusion portion protruding to the main circuit board side. As a result, the wiring length of the bus bar of the transformer can be further shortened, and thus heat dissipation from the bus bar (cooling of the transformer) can be performed more effectively. In addition, since the protrusion portion provided on the cover member of the cooling portion and protruding to the main circuit board side is exposed by the opening portion of the main circuit board, the cooling portion side fixed portion can be easily fixed to the protrusion portion via the opening portion even in a case where the cooling portion side fixed portion of the bus bar is fixed to the protrusion portion by a screw or the like.

In the configuration provided with the main circuit board, preferably, the bus bar includes a first bus bar having a substrate side fixed portion fixed to the main circuit board, the first bus bar has an extension portion provided so as to extend from the substrate side fixed portion so as to overlap the protrusion portion of the cover member when viewed from a direction in which the bus bar and the cooling portion face each other, an insulating member is disposed between the cooling portion and the extension portion, and the extension portion extending from the substrate side fixed portion is configured to dissipate heat to the cooling portion via the insulating member. With this configuration, it is possible to dissipate heat to the cooling portion via the insulating member in the extension portion extending from the substrate side fixed portion in addition to the cooling portion side fixed portion, and thus the heat generated in the transformer can be dissipated more efficiently.

In this case, preferably, the DC-DC converter unit includes a plurality of rectifying elements connected to an output side of the DC-DC converter unit with respect to the transformer and mounted on the main circuit board, the bus bar is disposed adjacent to the plurality of rectifying elements in a direction in which the plurality of rectifying elements is adjacent to each other and a direction intersecting the direction in which the bus bar and the cooling portion face each other, and the cooling portion side fixed portion of the bus bar is disposed at a position interposed between the plurality of rectifying elements when viewed from the direction in which the bus bar and the cooling portion face each other. With this configuration, the bus bar and the plurality of rectifying elements can be brought closer in the direction in which the bus bar and the plurality of rectifying elements are adjacent to each other. As a result, it is possible to suppress an increase in the size of the main circuit board in the direction in which the bus bar and the plurality of rectifying elements are adjacent to each other.

In the configuration including the first bus bar, preferably, the bus bar includes a second bus bar disposed on a side opposite to a side where the first bus bar is disposed with respect to the coil substrate, the cooling portion side fixed portion includes a first cooling portion side fixed portion of the first bus bar and a second cooling portion side fixed portion of the second bus bar, and the first cooling portion side fixed portion and the second cooling portion side fixed portion are fixed to the cooling portion in a state of being in contact with each other at a position overlapping the cooling flow path of the cooling portion when viewed from the direction in which the bus bar and the cooling portion face each other. With this configuration, the heat generated in the transformer can be dissipated to the cooling flow path via the cooling portion by each of the first cooling portion side fixed portion of the first bus bar and the second cooling portion side fixed portion of the second bus bar. As a result, the heat generated in the transformer can be dissipated more efficiently. In addition, since the first cooling portion side fixed portion and the second cooling portion side fixed portion are fixed to the cooling portion in a state of being in contact with each other, heat can be efficiently transferred from each of the first bus bar and the second bus bar to the cooling portion as compared with a case where the first cooling portion side fixed portion and the second cooling portion side fixed portion are fixed to the cooling portion in a state where a heat transfer member is interposed between the first cooling portion side fixed portion and the second cooling portion side fixed portion.

In the configuration including the first bus bar, preferably, the main circuit board is provided with a connection terminal where the substrate side fixed portion of the first bus bar is fastened and fixed, and a first engagement portion engaging with the first bus bar is provided, and the first bus bar is provided with a second engagement portion engaging with the first engagement portion. With this configuration, by engaging the first engagement portion of the connection terminal and the second engagement portion of the first bus bar with each other, it is possible to prevent the first bus bar from rotating when the substrate side fixed portion of the first bus bar is fastened and fixed to the main circuit board. As a result, it is possible to prevent the first bus bar from being distorted due to the first bus bar rotating when the substrate side fixed portion of the first bus bar is fastened and fixed to the main circuit board.

The configuration in which the cooling portion includes the cover member further includes an inverter unit converting DC power input from the DC power supply into AC power and supplying the power to a load, in which the inverter unit is attached to a surface of the cooling portion on a side opposite to a surface where the cover member is attached. With this configuration, the heat generated in the inverter unit attached to the surface of the cooling portion on the side opposite to the surface where the cover member is attached can be transferred to the cooling liquid flowing through the cooling flow path via the cooling portion provided with the cooling flow path. As a result, the heat generated in the inverter unit can be efficiently dissipated to the cooling liquid flowing through the cooling flow path via the cooling portion provided with the cooling flow path.

In this case, preferably, the power conversion device further includes a boost converter unit boosting the DC power input from the DC power supply and supplying the power to the inverter unit, in which the boost converter unit is attached to a surface of the cooling portion on a side where the cover member is attached. With this configuration, the heat generated in the boost converter unit attached to the surface of the cooling portion on the side where the cover member is attached can be transferred to the cooling liquid flowing through the cooling flow path via the cooling portion provided with the cooling flow path. As a result, the heat generated in the boost converter unit can be efficiently dissipated to the cooling liquid flowing through the cooling flow path via the cooling portion provided with the cooling flow path.

In the power conversion device according to the first aspect, preferably, the DC-DC converter unit further includes a smoothing reactor connected to a secondary side of the transformer, and a first cooling flow path cooling the bus bar of the transformer and a second cooling flow path cooling the smoothing reactor are formed in the cooling portion. With this configuration, the bus bar of the transformer and the smoothing reactor can be cooled by the first cooling flow path and the second cooling flow path, respectively.

In order to achieve the above object, a DC-DC converter device according to a second aspect of this invention includes a DC-DC converter element including a transformer having a coil substrate where a primary side coil is formed and a bus bar forming a secondary side coil and converting a voltage of DC power input from a DC power supply into a different voltage, in which the bus bar of the transformer has a cooling portion side fixed portion fixed to a cooling portion provided with a cooling flow path.

In the DC-DC converter device according to the second aspect, as described above, by fixing the cooling portion side fixed portion of the bus bar of the transformer to the cooling portion provided with the cooling flow path, the heat generated in the transformer can be transferred from the cooling portion side fixed portion to the cooling liquid flowing through the cooling flow path via the cooling portion provided with the cooling flow path. As a result, the heat generated in the transformer can be efficiently dissipated by the cooling liquid flowing through the cooling flow path to cool the transformer. As a result, it is possible to provide the DC-DC converter device capable of sufficiently dissipating the heat generated in the transformer from the bus bar of the transformer.

In the DC-DC converter device according to the second aspect, preferably, the cooling portion includes a main body member where the cooling flow path is formed and a cover member attached to the main body member, and the cooling portion side fixed portion of the bus bar is configured to be fixed to the cover member of the cooling portion. With this configuration, the heat generated in the transformer can be transferred to the cooling liquid flowing through the cooling flow path via the cover member of the cooling portion to which the cooling portion side fixed portion of the bus bar is fixed. As a result, the heat generated in the transformer can be efficiently dissipated to the cooling liquid flowing through the cooling flow path via the cover member of the cooling portion.

Preferably, the DC-DC converter device according to the second aspect further includes a smoothing reactor connected to a secondary side of the transformer, in which a first cooling flow path cooling the bus bar of the transformer and a second cooling flow path cooling the smoothing reactor are formed in the cooling portion. With this configuration, the bus bar of the transformer and the smoothing reactor can be cooled by the first cooling flow path and the second cooling flow path, respectively.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is an exploded perspective view of the base portion and the lid portion viewed from below the power conversion device according to one embodiment.

DETAILED DESCRIPTION OF THE INVENTION

Hereinafter, an embodiment of the present invention will be described with reference to the drawings.

The configuration of a power conversion device 100 according to one embodiment of the present invention will be described with reference to FIGS. 1 to 16. The power conversion device 100 is mounted in, for example, a vehicle.

Figure 1:
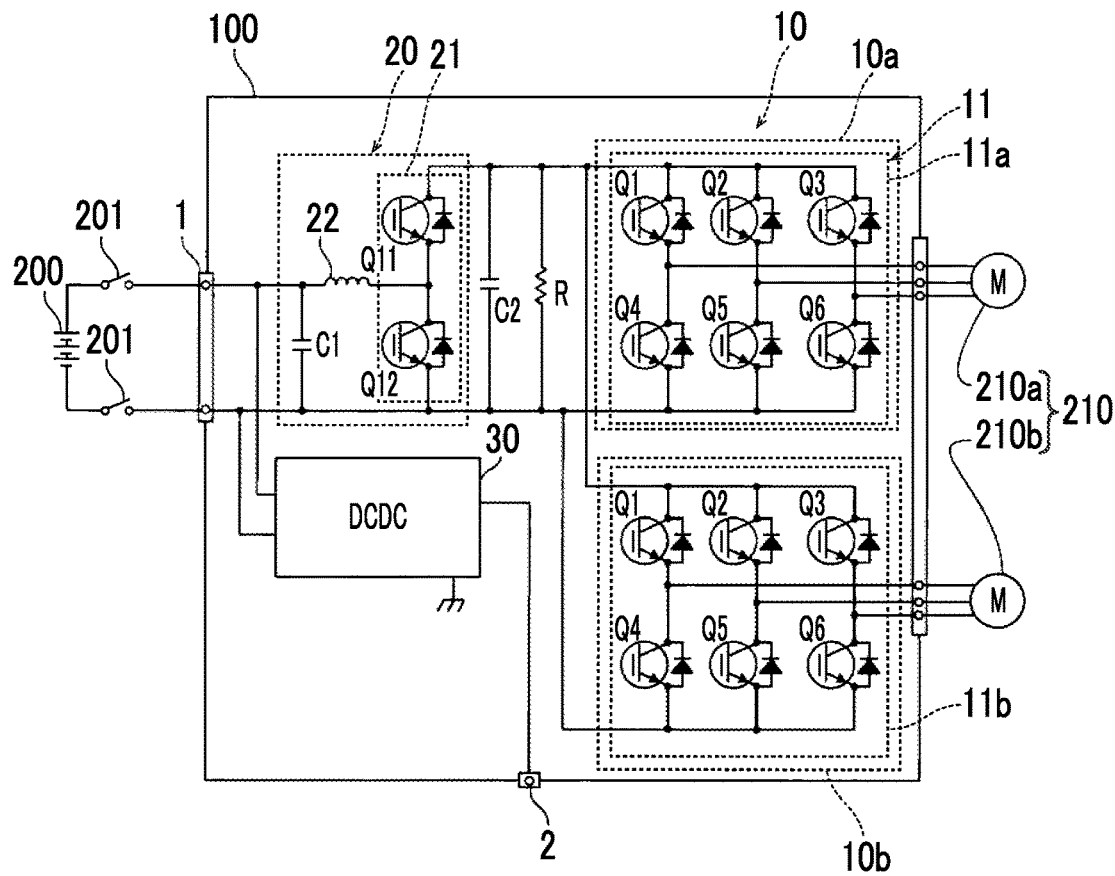
FIG. 1 is a diagram illustrating a circuit configuration of a power conversion device according to one embodiment of the present invention.

First, the circuit configuration of the power conversion device 100 will be described with reference to FIG. 1. The power conversion device 100 includes an inverter unit 10. The inverter unit 10 converts DC power input from a DC power supply 200 into AC power and supplies the power to a load 210. The load 210 is, for example, a motor. A switch 201 is provided between the power conversion device 100 and the DC power supply 200.

The inverter unit 10 includes a switching element module 11. The switching element module 11 converts DC power into AC power. In addition, the switching element module 11 includes semiconductor switching elements Q1, Q2, and Q3 constituting an upper arm and semiconductor switching elements Q4, Q5, and Q6 constituting a lower arm.

The inverter unit 10 includes a first inverter unit 10*a* and a second inverter unit 10*b*. The switching element module 11 includes a first switching element module 11*a* included in the first inverter unit 10*a* and a second switching element module 11*b* included in the second inverter unit 10*b*. In addition, the load 210 includes a first load 210*a* and a second load 210*b*. The first inverter unit 10*a* converts DC power input from the DC power supply 200 into AC power and supplies the power to the first load 210*a*. The second inverter unit 10*b* converts DC power input from the DC power supply 200 into AC power and supplies the power to the second load 210*b*.

The power conversion device 100 includes a boost converter unit 20. The boost converter unit 20 is disposed on the input side of the inverter unit 10. The boost converter unit 20 boosts DC power input from the DC power supply 200 and supplies the power to the inverter unit 10. The boost converter unit 20 includes a boost switching element module 21 and a reactor 22. The boost switching element module 21 includes boost switching elements Q11 and Q12. The boost switching elements Q11 and Q12 constitute an upper arm and a lower arm, respectively. In addition, the boost converter unit 20 includes a capacitor C1. The reactor 22 is provided between the positive side of the DC power supply 200 and the connection point between the boost switching element Q11 and the boost switching element Q12. The capacitor C1 is provided in parallel to the boost switching element Q12. It should be noted that at least one of the semiconductor switching elements Q1, Q2, Q3, Q4, Q5, and Q6 and the boost switching elements Q11 and Q12 may be a wide bandgap semiconductor element. The wide bandgap semiconductor element is a semiconductor element larger in bandgap than a silicon semiconductor element and is, for example, a semiconductor element containing SiC, GaN, diamond, a gallium nitride-based material, a gallium oxide-based material, AlN, AlGaN, ZnO, or the like. By using the wide bandgap semiconductor element for one of the semiconductor switching elements Q1 to Q6 and the boost switching elements Q11 and Q12, it is possible to improve the speed of switching as compared with a case where a silicon semiconductor element is used.

The power conversion device 100 includes a capacitor C2 and a resistor R. The capacitor C2 and the resistor R are provided between the boost converter unit 20 and the inverter unit 10. The capacitor C2 and the resistor R are provided in parallel to each other.

The power conversion device 100 includes a DCDC converter unit 30. It should be noted that the DCDC converter unit 30 is configured to convert the voltage of the DC power input from the DC power supply 200 into a different voltage. Specifically, the DCDC converter unit 30 steps down the voltage of the DC power input from the DC power supply 200 via a connector 1. In addition, the DCDC converter unit 30 supplies the stepped-down voltage to an output terminal 2. It should be noted that the DCDC converter unit 30 is an example of the "DC-DC converter unit" and the "DC-DC converter device" in the claims.

Figure 2:
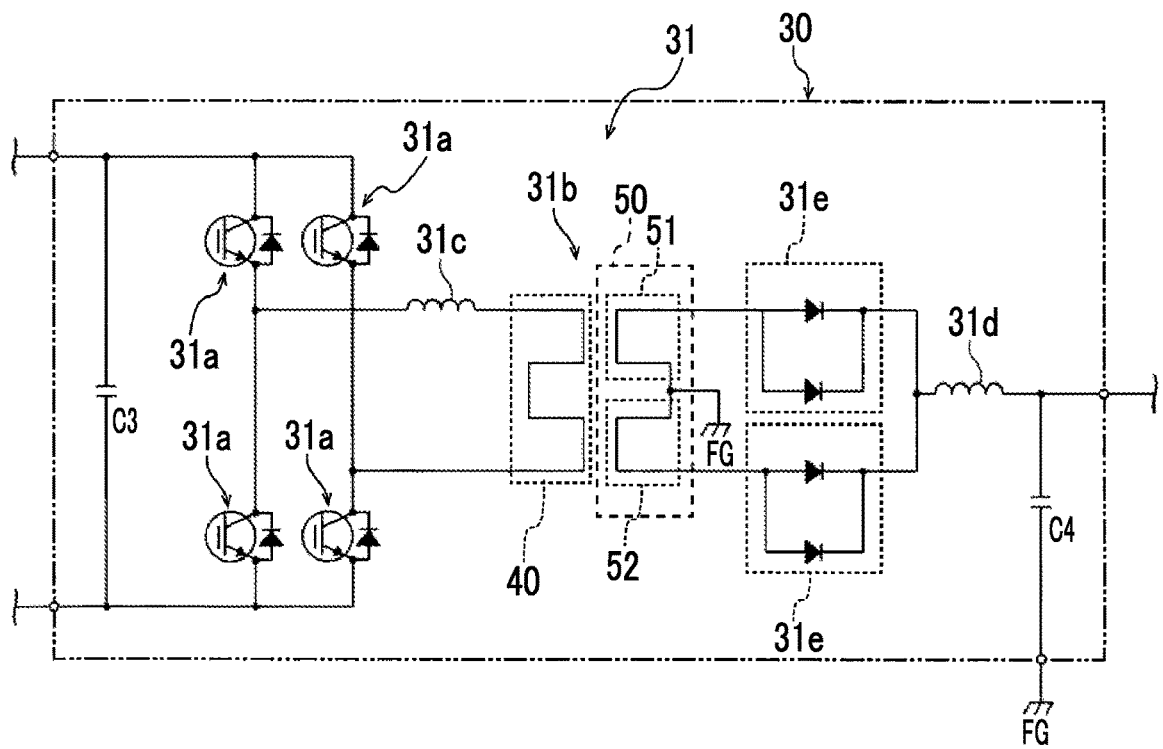
FIG. 2 is a diagram illustrating the circuit configuration of a DCDC converter unit of the power conversion device according to one embodiment.

In the present embodiment, as illustrated in FIG. 2, the DCDC converter unit 30 includes a DC-DC converter element 31. The DC-DC converter element 31 includes a plurality of (four) converter switching elements 31a, a transformer 31b, a resonance reactor 31c, a smoothing reactor 31d, and a plurality of (two) diode elements 31e. The power conversion device 100 is configured to convert the voltage of the DC power input from the DC power supply 200 into a different voltage with the DC-DC converter element 31 of the DCDC converter unit 30.

In addition, the transformer 31b has a coil substrate 40 where a primary side coil is formed and a bus bar 50 that forms a secondary side coil. Further, the bus bar 50 includes a first bus bar 51 and a second bus bar 52. One side of each of the first bus bar 51 and the second bus bar 52 is connected to a frame ground FG, and the other side of each of the first bus bar 51 and the second bus bar 52 is connected to the diode element 31e. In addition, a detailed configuration of the transformer 31b will be described later.

The resonance reactor 31c is connected to the primary side (coil substrate 40) side of the transformer 31b. In addition, the smoothing reactor 31d is connected to the secondary side (bus bar 50) side of the transformer 31b. The smoothing reactor 31d is connected to the output sides of the plurality of diode elements 31e on the secondary side (bus bar 50) side of the transformer 31b.

The plurality of diode elements 31e is connected to the output side of the DCDC converter unit 30 with respect to the transformer 31b. It should be noted that the plurality of diode elements 31e is an example of the "plurality of rectifying elements" in the claims.

In addition, the DCDC converter unit 30 includes capacitors C3 and C4. The capacitor C3 is connected to the input sides of the plurality of converter switching elements 31a. The capacitor C4 is disposed between the smoothing reactor 31d and the frame ground FG.

Next, the structure of the power conversion device 100 will be described.

Figure 3:
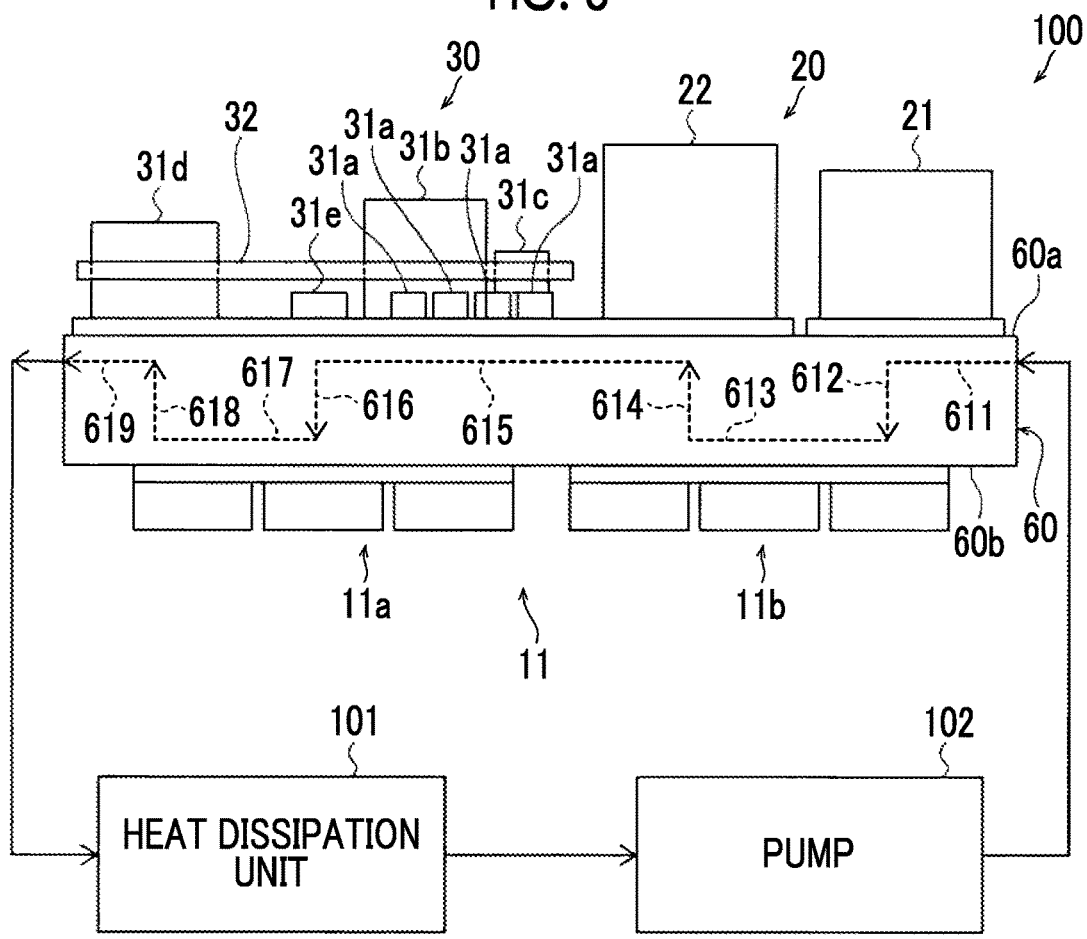
FIG. 3 is a side view of the power conversion device according to one embodiment.

As illustrated in FIG. 3, the power conversion device 100 includes a base portion 60. The base portion 60 has a flat plate shape. The switching element module 11 constituting the inverter unit 10, the boost converter unit 20, and the DCDC converter unit 30 are disposed on the base portion 60. In addition, the base portion 60 is formed of a metal having a relatively high thermal conductivity such as aluminum. The base portion 60 has a rectangular shape when viewed from a direction perpendicular to a front surface 60a and a back surface 60b of the base portion 60. It should be noted that the base portion 60 is an example of the "cooling portion" in the claims. In addition, the front surface 60a is an example of the "surface of the cooling portion on the side where the cover member is attached" in the claims and the back surface 60b is an example of the "surface of the cooling portion on the side opposite to the surface where the cover member is attached" in the claims.

In addition, the power conversion device 100 (DCDC converter unit 30) includes a converter substrate 32. It should be noted that the converter substrate 32 is an example of the "main circuit board" in the claims. The DC-DC converter element 31 is mounted on the converter substrate 32. The converter substrate 32 has a flat plate shape. The converter substrate 32 is a printed circuit board (PCB) where a wiring pattern is formed by a conductor and the DC-DC converter element 31 is mounted. The converter substrate 32 is disposed so as to face the base portion 60.

The switching element module 11 is attached to the back surface 60b of the base portion 60 along the back surface 60b of the base portion 60 having a flat plate shape. In addition, the first switching element module 11a and the second switching element module 11b are attached to the back surface 60b of the base portion 60 along the back surface 60b of the base portion 60 having a flat plate shape. Specifically, the first switching element module 11a and the second switching element module 11b are disposed adjacent to each other along the long side direction of the first switching element module 11a and the second switching element module 11b.

In the present embodiment, the boost converter unit 20 is attached to the base portion 60 along the front surface 60a or the back surface 60b of the base portion 60 having a flat plate shape. Specifically, the boost converter unit 20 is attached to the front surface 60a of the base portion 60. In addition, the boost converter unit 20 is disposed adjacent to the DCDC converter unit 30 along the longitudinal direction of the base portion 60 having a flat plate shape.

Further, the boost switching element module 21 and the reactor 22 are attached to the base portion 60 along the front surface 60a or the back surface 60b of the base portion 60 having a flat plate shape. Specifically, the converter substrate 32, the reactor 22, and the boost switching element module 21 are attached to the base portion 60 along the front surface 60a of the base portion 60 having a flat plate shape and adjacent to each other.

In addition, the converter substrate 32 on which the DC-DC converter element 31 is mounted is attached to the base portion 60 along the front surface 60a of the base portion 60 having a flat plate shape. It should be noted that as illustrated in FIG. 3, the converter substrate 32, the reactor 22, and the boost switching element module 21 are attached to the front surface 60a of the base portion 60 in this order. In addition, the converter substrate 32 is attached to a lid portion 63 (see FIG. 5), which is disposed on the front side (Z1 direction side) of the base portion 60 and will be described later.

In addition, as illustrated in FIG. 3, the converter switching element 31a and the diode element 31e are provided on the back surface side (Z2 direction side) of the converter substrate 32. In addition, the transformer 31b and resonance reactor 31c are provided so as to penetrate the converter substrate 32. Further, as will be described later, the smoothing reactor 31d is disposed on the Y1 direction side of the converter substrate 32 (see FIG. 9) and is provided from the front surface side (Z1 direction side) to the back surface side (Z2 direction side) of the converter substrate 32.

(Cooling Flow Path-Related Configuration)

Figure 4:
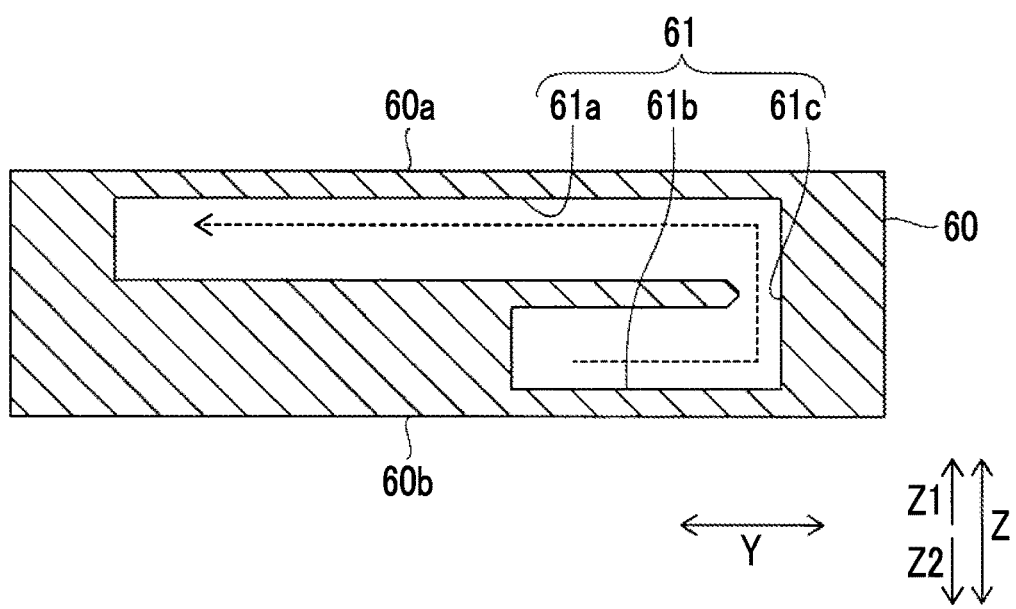
FIG. 4 is a side sectional view of a base portion of the power conversion device according to one embodiment.

As illustrated in FIG. 4, the base portion 60 includes a cooling flow path 61 through which a cooling liquid flows, and the cooling flow path 61 has a front side flow path 61a disposed on the front side (Z1 direction side) and a back side flow path 61b connected to the front side flow path 61a and disposed on the back side (Z2 direction side). In addition, the cooling flow path 61 has a connection flow path 61c connecting the front side flow path 61a and the back side flow path 61b in the base portion 60.

Further, the cooling flow path 61 is formed such that the front side flow path 61a and the back side flow path 61b are alternately connected and a cooling liquid alternately passes through the front side surface and the back side surface of the base portion 60. Specifically, as illustrated in FIG. 3, the cooling flow path 61 includes cooling flow paths 611, 615, and 619 as the front side flow path 61a disposed on the front side (front surface 60a side), cooling flow paths 613 and 617 as the back side flow path 61b disposed on the back side (back surface 60b side), and cooling flow paths 612, 614, 616, and 618 as the connection flow path 61c. The cooling flow path 61 is formed such that a cooling liquid flows in from one end side in the longitudinal direction of the base portion 60 and the cooling liquid flows out to the other end side.

As for the cooling flow path 61, the cooling flow paths 611, 612, 613, 614, 615, 616, 617, 618, and 619 are connected from upstream toward downstream in this order. In other words, as illustrated in FIG. 3, as for the cooling flow path 61, a cooling liquid flows in from the cooling flow path 611 of the front side flow path 61a and the cooling liquid flows out through the cooling flow path 612 of the connection flow path 61c, the cooling flow path 613 of the back side flow path 61b, the cooling flow path 614 of the connection flow path 61c, the cooling flow path 615 of the front side flow path 61a, the cooling flow path 616 of the connection flow path 61c, the cooling flow path 617 of the back side flow path 61b, the cooling flow path 618 of the connection flow path 61c, and the cooling flow path 619 of the front side flow path 61a.

In addition, the cooling liquid flowing out of the cooling flow path 61 is heat-dissipated by a heat dissipation unit 101 and cooled. In addition, the cooling liquid cooled by the heat dissipation unit 101 is sent by a pump 102 and flows into the cooling flow path 61 again. The heat dissipation unit 101 includes a heat exchanger and is cooled by external air. The heat dissipation unit 101 is, for example, a radiator. It should be noted that the pump 102 may be disposed between the outlet of the cooling flow path 61 and the heat dissipation unit 101 and the cooling liquid that is yet to be heat-dissipated by the heat dissipation unit 101 may be sent by the pump 102. In addition, the cooling liquid is, for example, a liquid such as water and antifreeze.

In addition, as illustrated in FIG. 3, the inverter unit 10 is disposed on the back side (back surface 60b side) of the base portion 60 and is cooled by the cooling liquid flowing through the back side flow path 61b. Specifically, the first switching element module 11a and the second switching element module 11b are disposed on the back side of the base portion 60 and are cooled by the cooling liquid flowing through the back side flow path 61b.

In addition, the DCDC converter unit 30 is disposed on the front side of the base portion 60 and is cooled by the cooling liquid flowing through the front side flow path 61a. Specifically, the converter switching element 31a, the transformer 31b, the resonance reactor 31c, the smoothing reactor 31d, the diode element 31e, the boost switching element module 21, and the reactor 22 are disposed on the front side (front surface 60a side) of the base portion 60 and are cooled by the cooling liquid flowing through the front side flow path 61a.

The DC-DC converter element 31 of the DCDC converter unit 30 may be disposed on the converter substrate 32 in view of the effect of thermal interference from the reactor 22. Specifically, as for the converter substrate 32, among the converter switching element 31a, the transformer 31b, the resonance reactor 31c, the smoothing reactor 31d, and the diode element 31e, disposing a component with low heat resistance on the side close to the reactor 22 may be avoided.

In addition to the DC-DC converter element 31, components such as a fuse, a capacitor, and a Hall sensor element are mounted on the converter substrate 32, and each of these components dissipates the heat thereof to the front surface 60a of the base portion 60 via a heat dissipation member.

In addition, the cooling flow path 61 is formed such that a cooling liquid flows such that the component highest in heat resistance-based priority is cooled first. Specifically, as for the cooling flow path 61, a flow path is formed such that the boost switching element module 21 and the reactor 22, which are relatively low in heat resistance, are cooled on the upstream side. Alternatively, the cooling flow path 61 is formed such that a high-cooling priority component is disposed on the upstream side based on the amount of heat generation.

In the present embodiment, the cooling flow path 61 is formed such that a cooling liquid flows such that cooling is performed in the order of the boost switching element module 21, the second switching element module 11b, the reactor 22, the converter switching element 31a, the transformer 31b, the resonance reactor 31c, the diode element 31e, the first switching element module 11a, and the smoothing reactor 31d.

The boost switching element module 21 is cooled by the cooling liquid flowing through the cooling flow path 611. In addition, the second switching element module 11b is cooled by the cooling liquid flowing through the cooling flow path 613. In addition, the reactor 22, the converter switching element 31a, the transformer 31b, the resonance reactor 31c, and the diode element 31e are cooled by the cooling liquid flowing through the cooling flow path 615. In addition, the first switching element module 11a is cooled by the cooling liquid flowing through the cooling flow path 617. In addition, the smoothing reactor 31d is cooled by the cooling liquid flowing through the cooling flow path 619. It should be noted that the cooling flow path 615 is an example of the "first cooling flow path" in the claims and the cooling flow path 619 is an example of the "second cooling flow path" in the claims.

Figure 5:
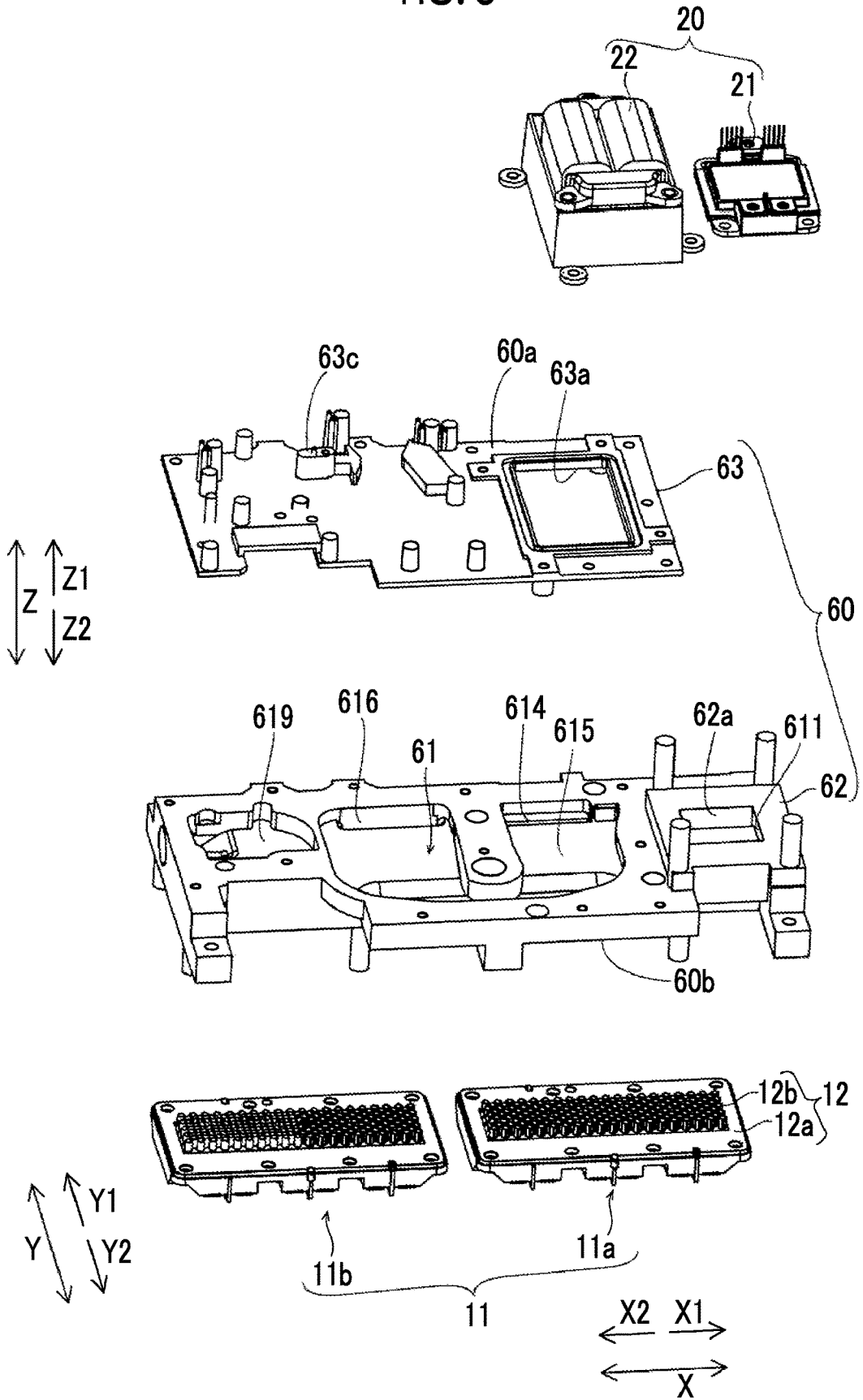
FIG. 5 is an exploded perspective view of the base portion and a lid portion viewed from above the power conversion device according to one embodiment.

In addition, in the present embodiment, as illustrated in FIGS. 5 and 6, the base portion 60 includes a metallic cooling portion main body portion 62 where the cooling flow path 61 is formed and lid portions 12, 21a, 22a, and 63, which are metallic and form the cooling flow path 61 together with the cooling portion main body portion 62. The lid portions 12, 21a, 22a, and 63 are attached to the cooling portion main body portion 62. It should be noted that the cooling portion main body portion 62 is an example of the "main body member" in the claims and the lid portion 63 is an example of the "cover member" in the claims. In addition, the lid portion 63 is attached to the cooling portion main body portion 62 by a screw (not illustrated).

As illustrated in FIG. 5, the lid portion 12 is disposed on the base portion 60 side (Z1 side) of the switching element module 11. Further, the switching element module 11 is attached to the lid portion 12 disposed on the back side (Z1 direction side) of the base portion 60. The lid portion 12 is formed of a metal having a relatively high thermal conductivity such as aluminum. The lid portion 12 includes a main body portion 12a having a flat plate shape and a plurality of pillar portions 12b protruding toward the base portion 60. The pillar portion 12b is formed so as to protrude into the cooling flow path 61.

In addition, the lid portion 12 covers the cooling flow path 61 provided on the back surface 60b of the base portion 60. Two lid portions 12 are provided. The lid portion 12 has a rectangular shape and a flat plate shape. The first switching element module 11a and the second switching element module 11b are provided integrally with the lid portions 12, respectively.

In addition, as illustrated in FIG. 5, the lid portion 63 covers the cooling flow path 61 provided on the front surface 60a of the base portion 60. The lid portion 63 has a rectangular shape and a flat plate shape. The lid portion 63 is formed of a metal having a relatively high thermal conductivity such as aluminum.

In addition, the cooling portion main body portion 62 is provided with a hole portion 62a. The boost switching element module 21 is disposed so as to cover the hole portion 62a of the cooling portion main body portion 62. Heat generated from the boost switching element module 21 is dissipated to the cooling liquid flowing through the cooling flow path 61. The boost switching element module 21 is attached to the cooling portion main body portion 62 by, for example, a screw (not illustrated).

Further, as illustrated in FIG. 6, the lid portion 21a is disposed on the base portion 60 side (Z2 side) of the boost switching element module 21. The lid portion 21a is formed of a metal having a relatively high thermal conductivity such as aluminum and copper. The lid portion 21a includes a main body portion 21b having a flat plate shape and a plurality of pillar portions 21c protruding toward the base portion 60. The pillar portion 21c is formed so as to protrude into the cooling flow path 61. The boost switching element module 21 has a square shape when viewed from a direction perpendicular to the front surface of the boost switching element module 21 (Z2 direction side). It should be noted that the pillar portion 21c may have a fin function (shape).

In addition, the lid portion 21a covers the cooling flow path 61 provided on the front surface 60a of the base portion 60. The lid portion 21a has a rectangular shape and a flat plate shape. The boost switching element module 21 is provided integrally with the lid portion 21a.

In addition, the lid portion 22a is disposed on the base portion 60 side (Z2 side) of the reactor 22. The lid portion 22a is formed of a metal having a relatively high thermal conductivity such as aluminum. The lid portion 22a includes a main body portion 22b and a plurality of fins 22c protruding toward the base portion 60. The fin 22c is formed so as to protrude into the cooling flow path 61. The fin 22c is formed so as to extend along the cooling flow path 61.

In addition, as illustrated in FIG. 6, the lid portion 63 is provided with a hole portion 63a. The reactor 22 is disposed so as to cover the hole portion 63a of the lid portion 63. In other words, the reactor 22 is disposed so as to cover the cooling flow path 61. Heat generated from the reactor 22 is dissipated to the cooling liquid flowing through the cooling flow path 61. The reactor 22 is attached to the lid portion 63 by, for example, a screw (not illustrated). In addition, the lid portion 63 is provided with a fin 63b protruding into the cooling flow path 61. The fin 63b is formed so as to extend along the cooling flow path 61.

The cooling portion main body portion 62 is provided with a pair of hole portions 62b. The first switching element module 11a and the second switching element module 11b are disposed so as to cover the hole portions 62b, respectively. In other words, the first switching element module 11a and the second switching element module 11b are disposed so as to cover the cooling flow path 61. Heat generated from the switching element module 11 is dissipated to the cooling liquid flowing through the cooling flow path 61.

Figure 7:
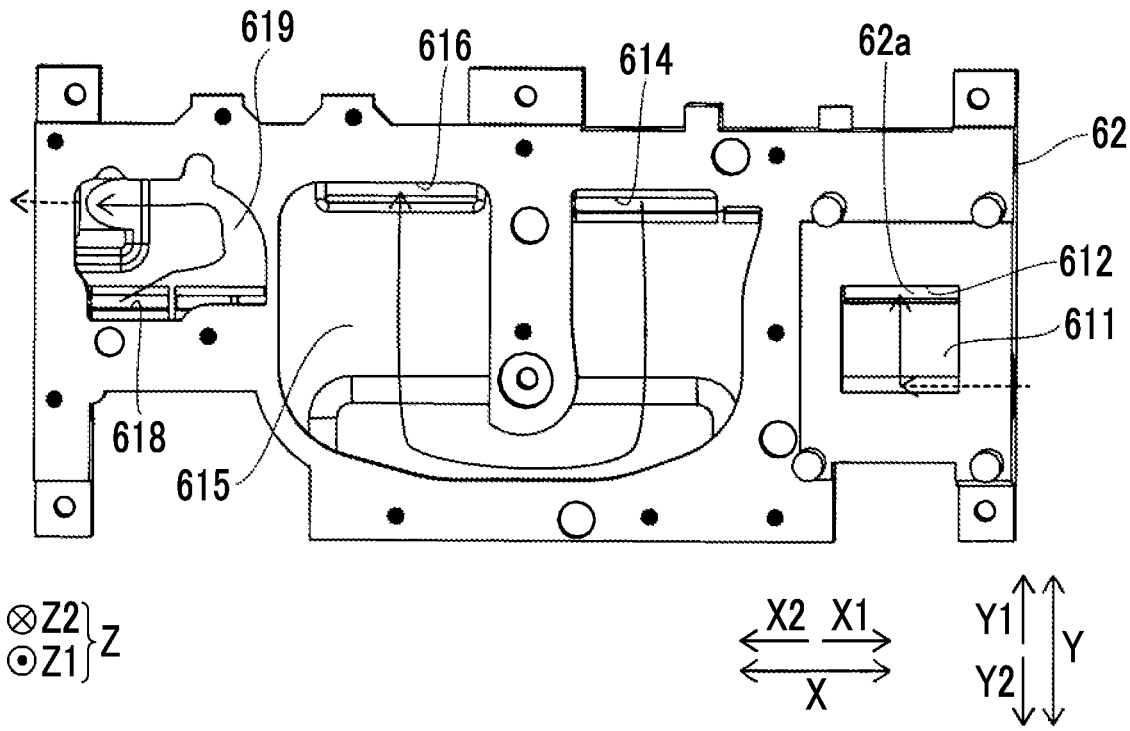
FIG. 7 is a top view of the base portion of the power conversion device according to one embodiment.
Figure 8:
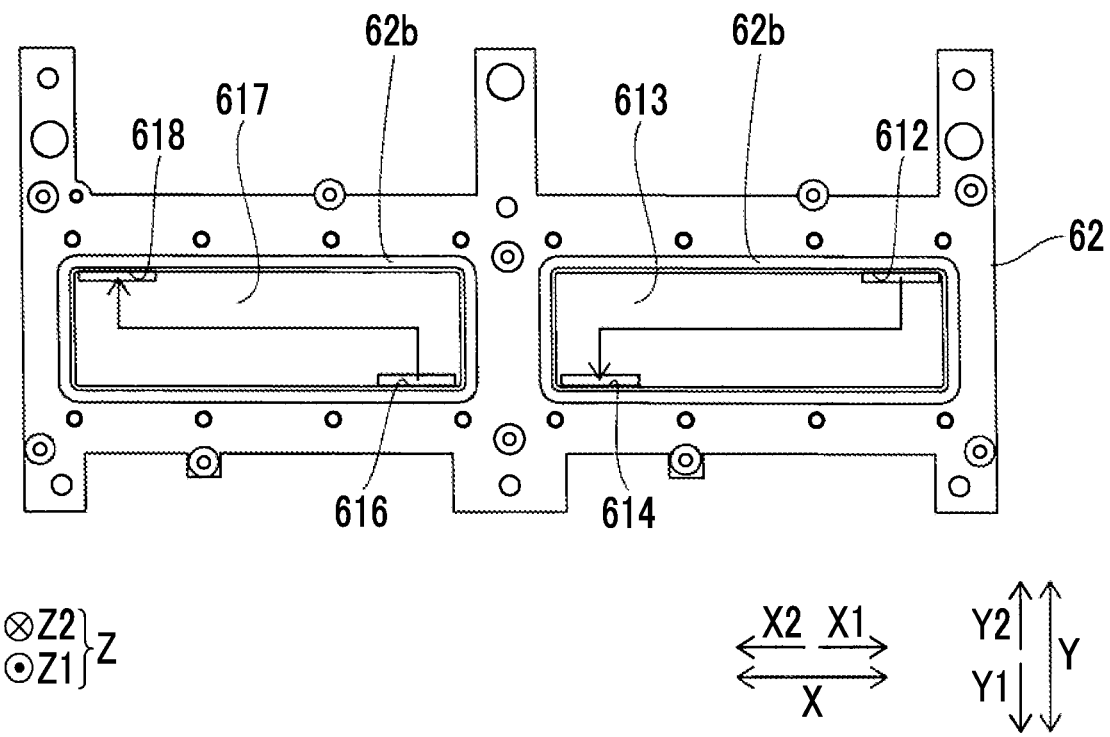
FIG. 8 is a bottom view of the base portion of the power conversion device according to one embodiment.

As described above, the cooling flow path 61 is provided on both the front surface 60a and the back surface 60b of the base portion 60. Further, as illustrated in FIGS. 7 and 8, as for the cooling flow path 61, a cooling liquid flows in from the cooling flow path 611 of the front side flow path 61a and the cooling liquid flows out through the cooling flow path 612 of the connection flow path 61c, the cooling flow path 613 of the back side flow path 61b, the cooling flow path 614 of the connection flow path 61c, the cooling flow path 615 of the front side flow path 61a, the cooling flow path 616 of the connection flow path 61c, the cooling flow path 617 of the back side flow path 61b, the cooling flow path 618 of the connection flow path 61c, and the cooling flow path 619 of the front side flow path 61a.

(Configuration of DCDC Converter Unit)

Figure 9:
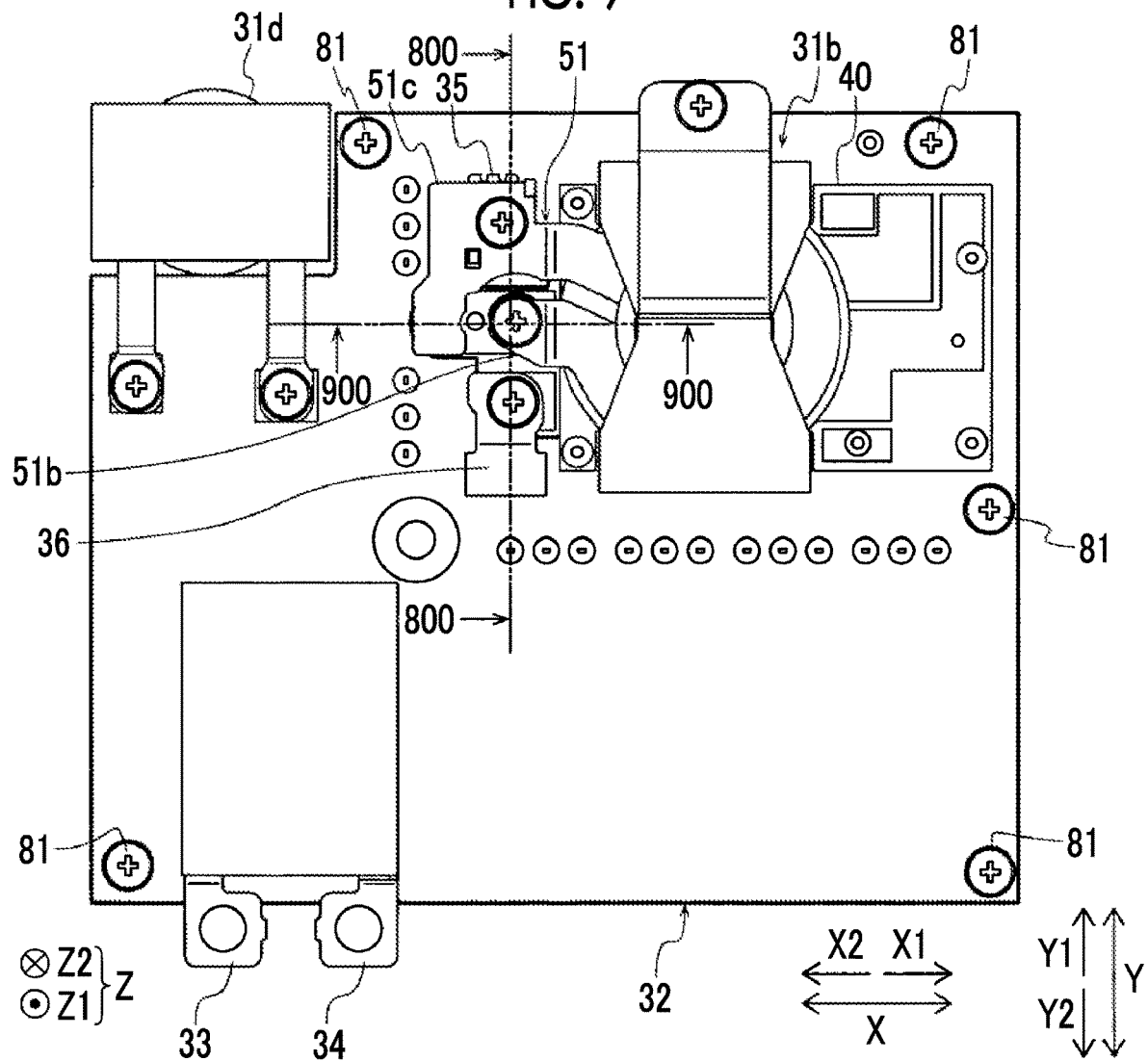
FIG. 9 is a top view of a converter substrate according to one embodiment.

The converter substrate 32 is attached to the lid portion 63 by a plurality of screws 81 illustrated in FIG. 9. As a result, the converter substrate 32 and the DC-DC converter element 31 mounted on the converter substrate 32 can be easily replaced simply by removing the plurality of screws 81.

Connection terminals 33 and 34 are provided on the converter substrate 32. The connection terminals 33 and 34 are terminals electrically connected to the connector 1 (see FIG. 1). In addition, as illustrated in FIG. 9, the converter substrate 32 is provided with a connection terminal 35 to which the first bus bar 51 is connected and a connection terminal 36 to which the second bus bar 52 is connected.

In addition, the transformer 31b and the smoothing reactor 31d are disposed closer to the Y1 direction side than the middle of the converter substrate 32 when viewed from the Z1 direction side. In addition, the transformer 31b is disposed on the X1 direction side of the converter substrate 32 when viewed from the Z1 direction side. In addition, the smoothing reactor 31d is disposed on the X2 direction side of the converter substrate 32 when viewed from the Z1 direction side.

Figure 10:
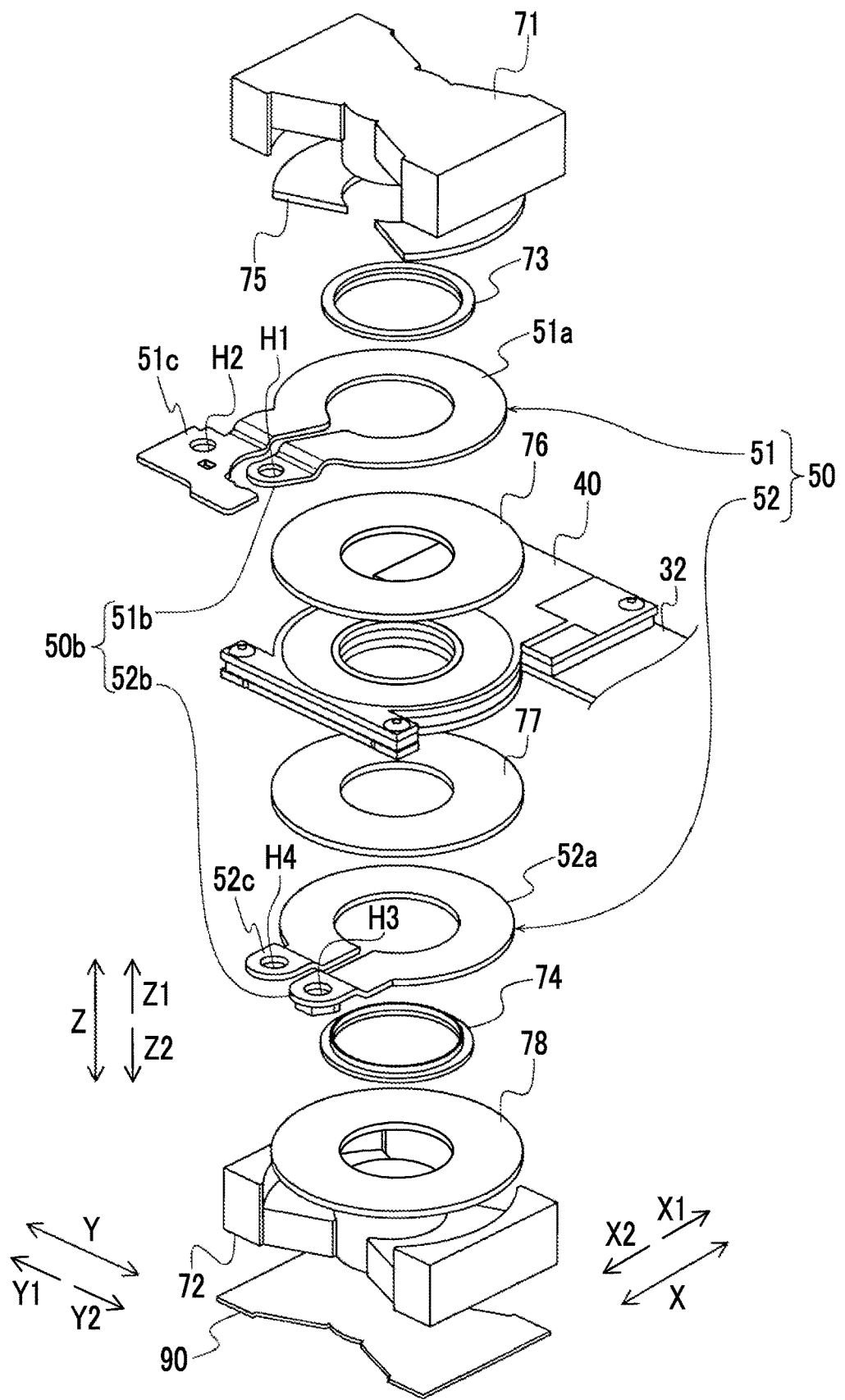
FIG. 10 is an exploded perspective view of a transformer.

The transformer 31b is a planar transformer as illustrated in FIG. 10. The transformer 31b has magnetic cores 71 and 72 disposed so as to interpose the coil substrate 40 where the primary side coil is formed and the bus bar 50 forming the secondary side coil. The magnetic cores 71 and 72 have an E shape when viewed from the X2 direction side (X1 direction side).

In addition, the bus bar 50 includes the first bus bar 51 and the second bus bar 52. The first bus bar 51 is disposed on the Z1 direction side of the coil substrate 40. Further, the second bus bar 52 is disposed on the side (Z2 direction side) opposite to the side (Z1 direction side) where the first bus bar 51 is disposed with respect to the coil substrate 40.

In addition, the transformer 31b has bobbins 73 and 74 and gap fillers 75, 76, 77, and 78. In addition, grease 90 is applied to the Z2 direction side (base portion 60 side) of the magnetic core 72 of the transformer 31b.

The bobbin 73 is disposed so as to be interposed between the magnetic core 71 and the first bus bar 51. Further, the bobbin 74 is disposed so as to be interposed between the second bus bar 52 and the magnetic core 72. The bobbins 73 and 74 are insulating members. The bobbin 73 is formed of, for example, an insulating resin.

The gap fillers 75 and 76 are disposed so as to sandwich the first bus bar 51 in the Z direction. In addition, the gap fillers 76 and 77 are disposed so as to sandwich the coil substrate 40 in the Z direction. Further, the gap fillers 77 and 78 are disposed so as to sandwich the second bus bar 52 in the Z direction. The gap fillers 75 to 78 are insulating members. The gap fillers 75 to 78 are, for example, thermally conductive heat dissipation materials containing silicone.

The bus bar 50 of the transformer 31b has a cooling portion side fixed portion 50b fixed to the base portion 60 where the cooling flow path 61 is provided. The cooling portion side fixed portion 50b includes a fixed portion 51b and a fixed portion 52b.

Specifically, the first bus bar 51 has a main body portion 51a having a circular ring shape (C shape), the fixed portion 51b fixed to the base portion 60 (lid portion 63), and a fixed portion 51c fixed to the converter substrate 32. It should be noted that the fixed portion 51b is an example of the "first cooling portion side fixed portion" in the claims and the fixed portion 51c is an example of the "substrate side fixed portion" in the claims.

In addition, the second bus bar 52 has a main body portion 52a having a circular ring shape (C shape), the fixed portion 52b fixed to the base portion 60 (lid portion 63), and a fixed portion 52c fixed to the converter substrate 32. It should be noted that the fixed portion 52b is an example of the "second cooling portion side fixed portion" in the claims.

Further, the fixed portions 51b, 51c, 52b, and 52c are provided with fastening hole portions H1, H2, H3, and H4, respectively. The cooling portion side fixed portion 50b of the bus bar 50 is fixed to the lid portion 63 of the base portion 60 as will be described later. In the present embodiment, the fixed portion 51b of the first bus bar 51 and the fixed portion 52b of the second bus bar 52 are fixed to the lid portion 63 of the base portion 60.

Figure 11:
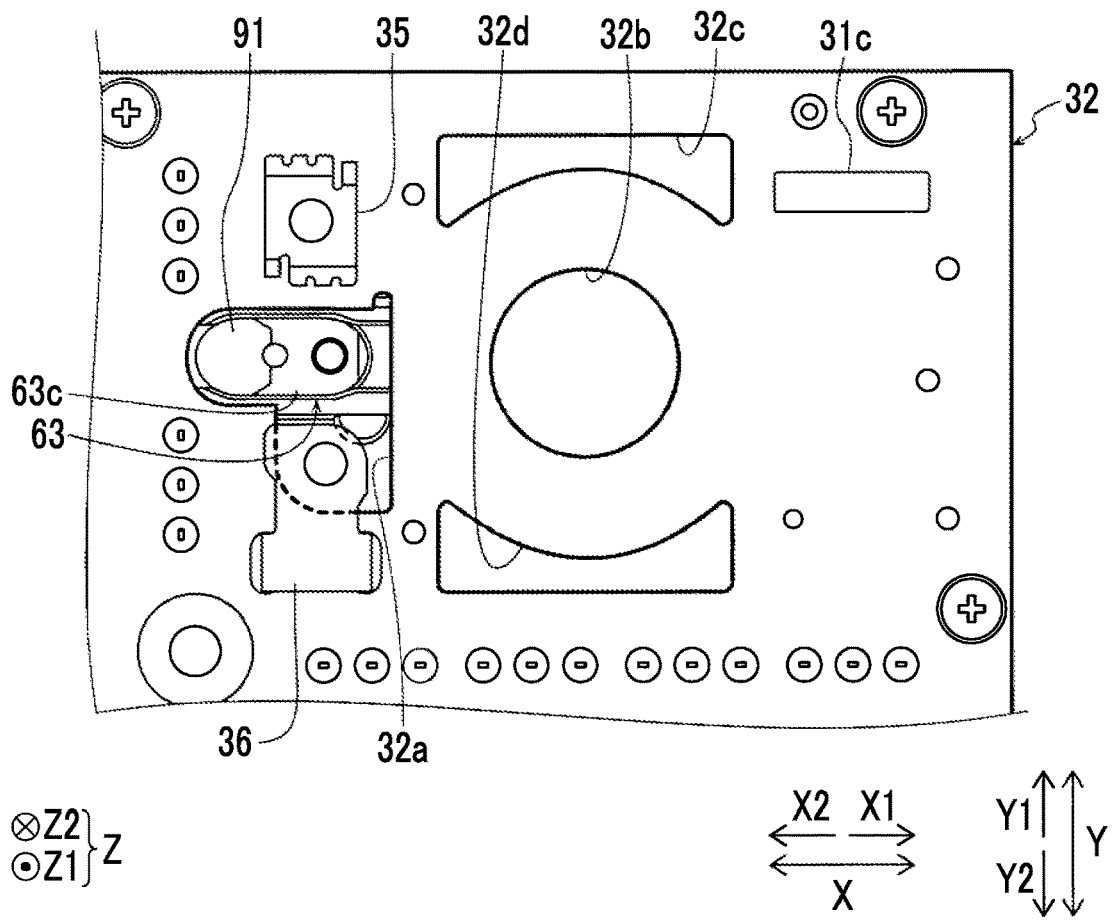
FIG. 11 is a diagram illustrating the converter substrate in a state where the transformer is removed.

As illustrated in FIG. 11, the converter substrate 32 is provided with an opening portion 32a for exposing the lid portion 63. In the present embodiment, the opening portion 32a exposes a protrusion portion 63c of the lid portion 63. Further, the bus bar 50 is fixed to the protrusion portion 63c exposed by the opening portion 32a. It should be noted that details of the fixing of the bus bar 50 to the protrusion portion 63c will be described later. In addition, the converter substrate 32 is provided with opening portions 32b, 32c, and 32d for penetration by the magnetic cores 71 and 72, which have an E shape (see FIG. 10) when viewed from the X2 direction side (X1 direction side) as described above.

In addition, the coil substrate 40 of the transformer 31b is disposed (mounted) on the Z1 direction side of the converter substrate 32. In addition, a conductor pattern 40a (see FIG. 12) of the coil substrate 40 is configured to be in contact with a conductor pattern for heat dissipation provided on the converter substrate 32 to dissipate the heat generated in the coil substrate 40 from the converter substrate 32.

Figure 12:
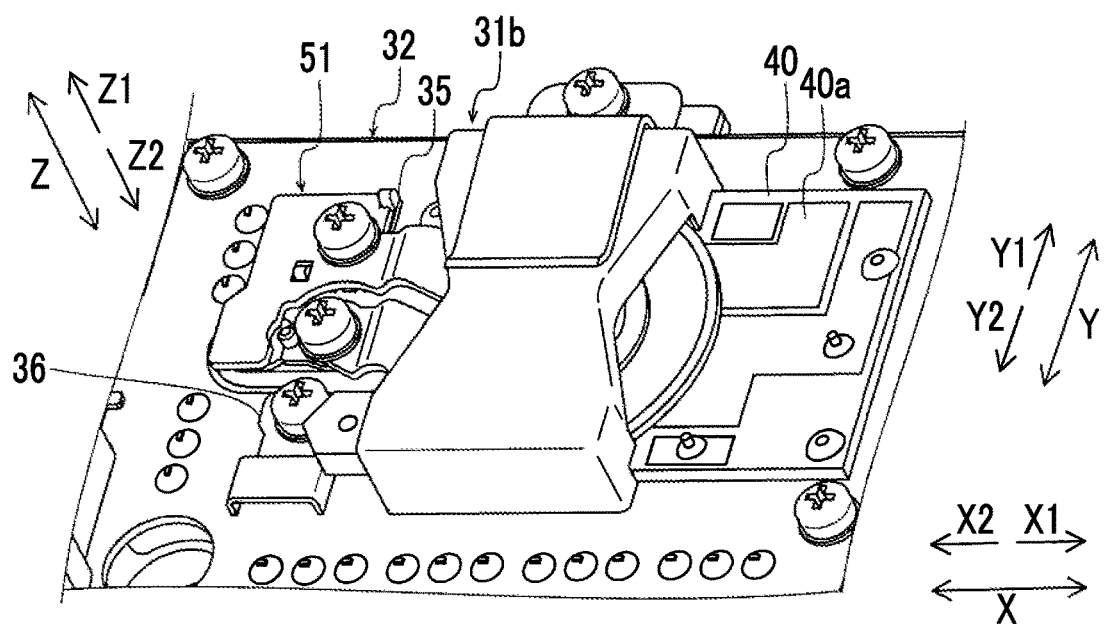
FIG. 12 is an enlarged partial perspective view of the transformer mounted on the converter substrate.
Figure 13:
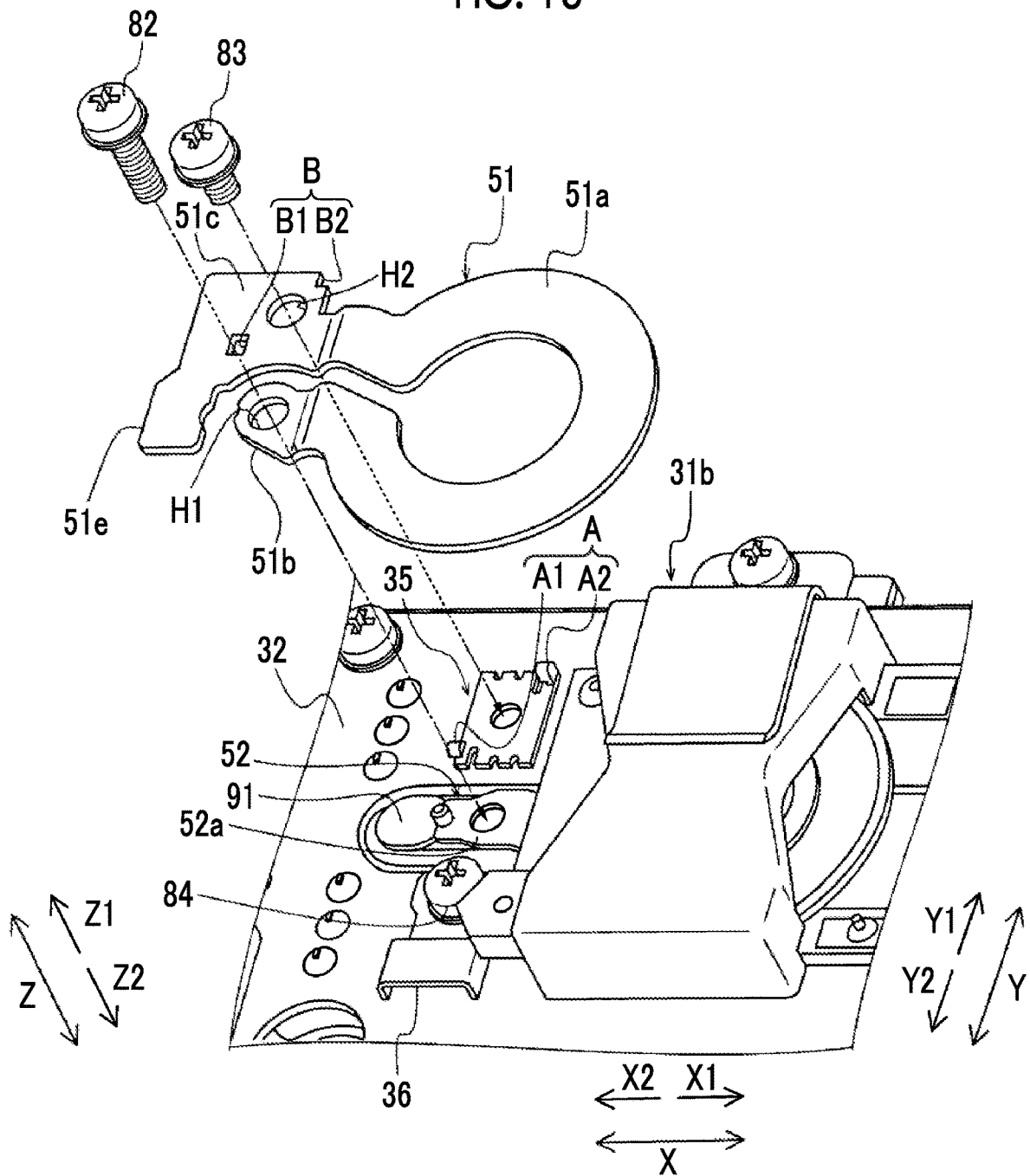
FIG. 13 is a perspective view illustrating a first engagement portion of a connection terminal of the converter substrate and a second engagement portion of a first bus bar.

In addition, as illustrated in FIGS. 12 and 13, the converter substrate 32 is provided with the connection terminal 35 to which the fixed portion 51c of the first bus bar 51 is fastened and fixed. In addition, the converter substrate 32 is provided with the connection terminal 36 to which the second bus bar 52 is fastened and fixed. The connection terminals 35 and 36 are connected to the conductor pattern of the converter substrate 32. The first bus bar 51 and the second bus bar 52 are electrically connected to the conductor pattern of the converter substrate 32 via the connection terminals 35 and 36, respectively. In other words, the converter substrate 32 is configured such that the bus bar 50 of the transformer 31b is connected. Further, the first bus bar 51 and the second bus bar 52 are electrically connected to the diode element 31e via the conductor pattern of the converter substrate 32.

As illustrated in FIG. 13, the connection terminal 35 is provided with a first engagement portion A engaging with the first bus bar 51. Further, the first engagement portion A includes protrusion portions A1 and A2 protruding to the first bus bar 51 side (Z1 direction side).

In addition, the first bus bar 51 is provided with a second engagement portion B engaging with the first engagement portion A of the connection terminal 35. The second engagement portion B includes a hole portion B1 engaging with the protrusion portion A1 and a notch portion B2 engaging with the protrusion portion A2.

In addition, the first bus bar 51 has an extension portion 51e provided so as to extend from the fixed portion 51c. The extension portion 51e is formed so as to extend from the fixed portion 51c toward the Y2 direction side. In addition, the extension portion 51e is disposed on the X2 direction side of the fixed portion 51b, and the extension portion 51e and the fixed portion 51b are disposed adjacent to each other in the X direction.

Figure 14:
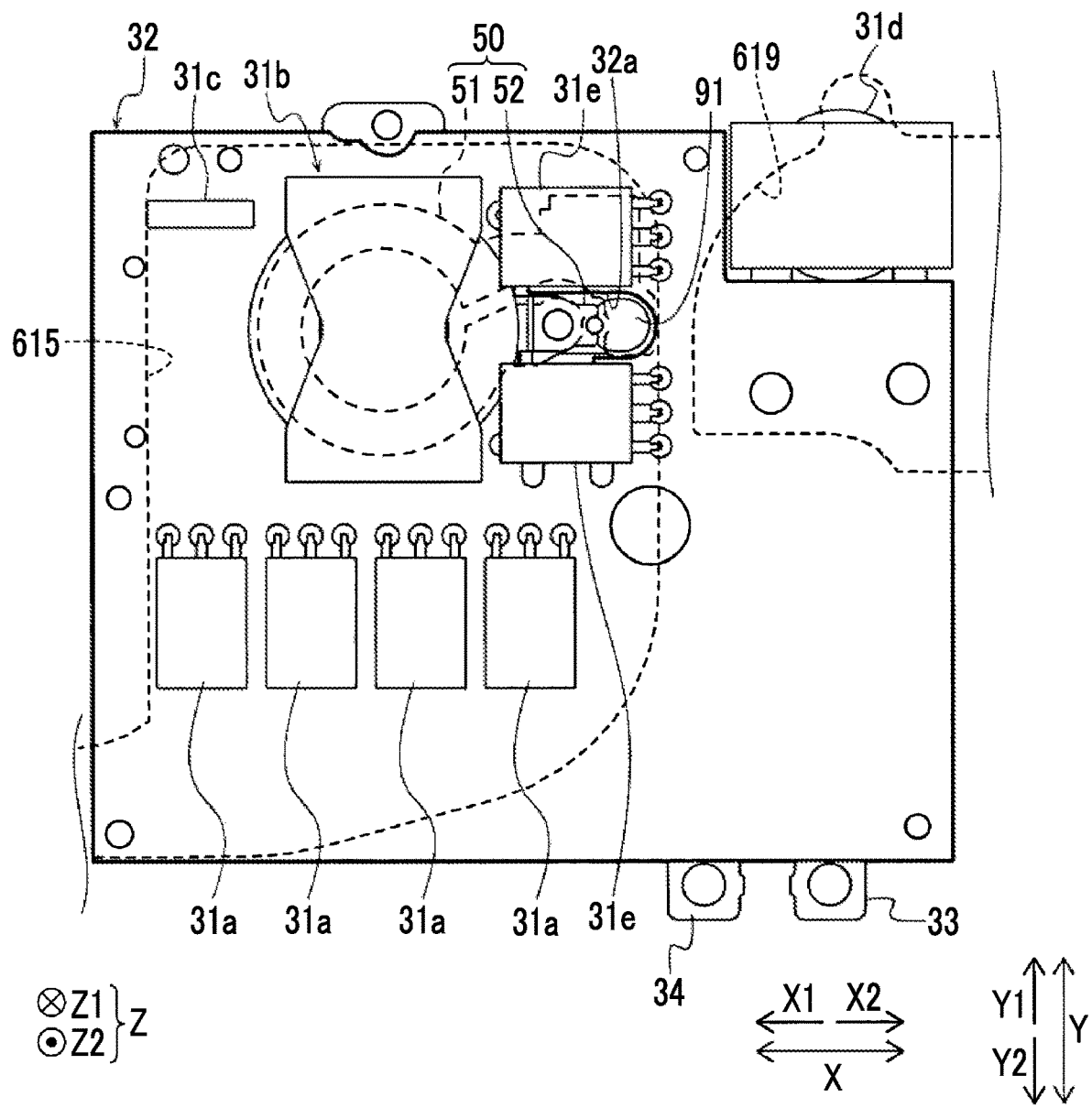
FIG. 14 is a bottom view of the converter substrate according to one embodiment.

As illustrated in FIG. 14, the plurality of diode elements 31e is mounted on the converter substrate 32. The plurality of diode elements 31e is disposed adjacent to each other in the Y direction on the Z2 direction side of the converter substrate 32. Further, the bus bar 50 (first bus bar 51 and second bus bar 52) is disposed adjacent to the plurality of diode elements 31e in the Y direction in which the plurality of diode elements 31e is adjacent to each other and the X direction intersecting the Z direction in which the bus bar 50 and the base portion 60 face each other. In addition, the plurality of (four) converter switching elements 31a is disposed adjacent to each other in the X direction on the Z2 direction side of the converter substrate 32.

The resonance reactor 31c is disposed on the X1 direction side of the transformer 31b. In addition, the plurality of diode elements 31e is disposed on the X2 direction side of the transformer 31b, and the plurality of converter switching elements 31a is disposed on the Y2 direction side of the transformer 31b.

Further, the plurality of (four) converter switching elements 31a, the transformer 31b, the resonance reactor 31c, and the plurality of (two) diode elements 31e are disposed so as to overlap the cooling flow path 615, which is the cooling flow path 61 provided in the base portion 60, when viewed from the Z2 direction side. It should be noted that as described above, the cooling flow path 615 is provided between the cooling flow path 613 used for cooling the second switching element module 11b and the cooling flow path 617 used for cooling the first switching element module 11a (see FIG. 3).

In addition, as illustrated in FIG. 14, the smoothing reactor 31*d* is disposed so as to overlap the cooling flow path 619, which is the cooling flow path 61 provided in the base portion 60, when viewed from the Z2 direction side. It should be noted that as described above, the cooling flow path 619 is provided between the cooling flow path 617 used for cooling the first switching element module 11*a* and a flow path outside the base portion 60 (heat dissipation unit 101) (see FIG. 3).

Figure 15:
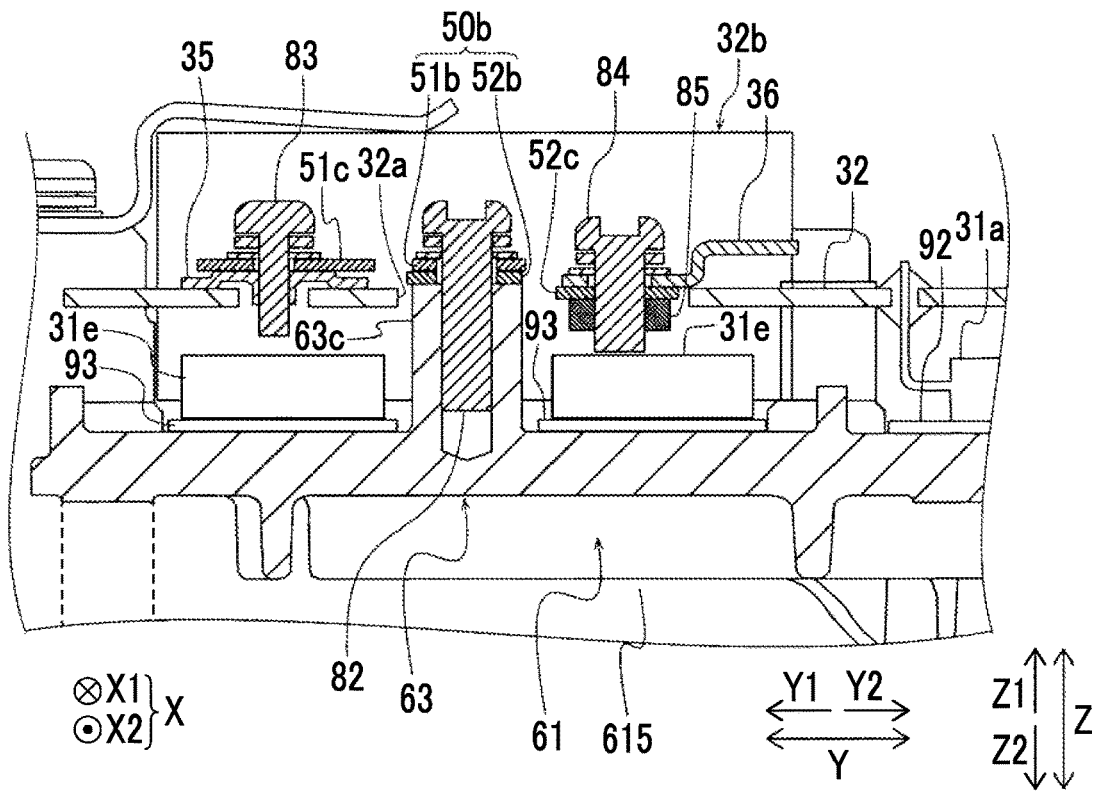
FIG. 15 is a sectional view along line 800-800 of FIG. 9.

As illustrated in FIG. 15, the converter substrate 32 is disposed along the lid portion 63. In addition, the lid portion 63 of the base portion 60 has the protrusion portion 63*c* protruding to the converter substrate 32 side (Z1 direction side). Further, the cooling portion side fixed portion 50*b* (fixed portions 51*b* and 52*b*) of the bus bar 50 is fixed to the protrusion portion 63*c* of the lid portion 63. The protrusion portion 63*c* of the lid portion 63 is disposed at a position interposed between the plurality of diode elements 31*e* when viewed from the direction in which the bus bar 50 and the base portion 60 face each other (Z1 direction side).

The cooling portion side fixed portion 50*b* of the bus bar 50 is disposed at a position interposed between the plurality of diode elements 31*e* when viewed from the direction in which the bus bar 50 and the base portion 60 face each other (Z1 direction side). Specifically, the protrusion portion 63*c* of the lid portion 63, the fixed portion 51*b*, and the fixed portion 52*b* are disposed at positions interposed between the plurality of (two) diode elements 31*e* in the Y direction.

In addition, the cooling portion side fixed portion 50*b* (fixed portions 51*b* and 52*a*) of the bus bar 50 is disposed so as to overlap the cooling flow path 61 (cooling flow path 615) provided in the base portion 60 when viewed from the direction in which the bus bar 50 and the base portion 60 face each other (Z1 direction side or Z2 direction side).

In addition, the fixed portion 51*b* and the fixed portion 52*b* are fixed to the base portion 60 in a state of being in contact with each other at a position overlapping the cooling flow path 61 (cooling flow path 615) of the base portion 60 when viewed from the direction in which the bus bar 50 and the base portion 60 face each other (Z1 direction side or Z2 direction side). Specifically, the fixed portion 51*b*, the fixed portion 52*b*, and the lid portion 63 (protrusion portion 63*c*) are disposed in this order from the Z1 direction side. Further, the fixed portion 51*b* of the first bus bar 51 and the fixed portion 52*b* of the second bus bar 52 are fastened and fixed to the lid portion 63 (protrusion portion 63*c*) by a screw 82 fastened from the Z1 direction side. In addition, the fixed portion 51*b* and the fixed portion 52*b* are fixed portions for respectively fixing the first bus bar 51 and the second bus bar 52 to the lid portion 63 (base portion 60) and are also heat dissipation units for performing heat dissipation with respect to the lid portion 63 of the base portion 60 provided with the cooling flow path 61. As a result, an increase in the size of the first bus bar 51 can be suppressed as compared with a case where the first bus bar 51 is provided with a heat dissipation unit in addition to the fixed portion 51*b* for fixing to the converter substrate 32. In addition, an increase in the size of the second bus bar 52 can be suppressed as compared with a case where the second bus bar 52 is provided with a heat dissipation unit in addition to the fixed portion 52*b* for fixing to the converter substrate 32.

In addition, the fixed portion 51*c* of the first bus bar 51 is disposed on the Z1 direction side of the connection terminal 35 of the converter substrate 32. Further, the fixed portion 51*c* of the first bus bar 51 is fastened and fixed to the connection terminal 35 of the converter substrate 32 by a screw 83 fastened from the Z1 direction side. In addition, the fixed portion 52*c* of the second bus bar 52 is disposed on the Z2 direction side of the connection terminal 36 of the converter substrate 32. Further, the fixed portion 52*c* of the second bus bar 52 is fastened and fixed to the connection terminal 36 of the converter substrate 32 by a screw 84 and a nut 85 disposed so as to interpose the connection terminal 36 of the converter substrate 32 in the Z direction.

Further, the converter switching element 31*a* is attached so as to come into contact with the lid portion 63 via a heat conductive member 92 on the lid portion 63 side (Z2 direction side) of the converter substrate 32. In other words, the lid portion 63, the heat conductive member 92, and the converter switching element 31*a* are stacked in this order from the Z2 direction side. Heat generated from the converter switching element 31*a* is dissipated to the lid portion 63 via the heat conductive member 92. The heat conductive member 92 is made of, for example, a ceramic sheet.

In addition, the diode element 31*e* is attached so as to come into contact with the lid portion 63 via a heat conductive member 93 on the lid portion 63 side (Z2 direction side) of the converter substrate 32. In other words, the lid portion 63, the heat conductive member 93, and the diode element 31*e* are stacked in this order from the Z2 direction side. Heat generated from the diode element 31*e* is dissipated to the lid portion 63 via the heat conductive member 93. The heat conductive member 93 is made of, for example, a ceramic sheet.

Figure 16:
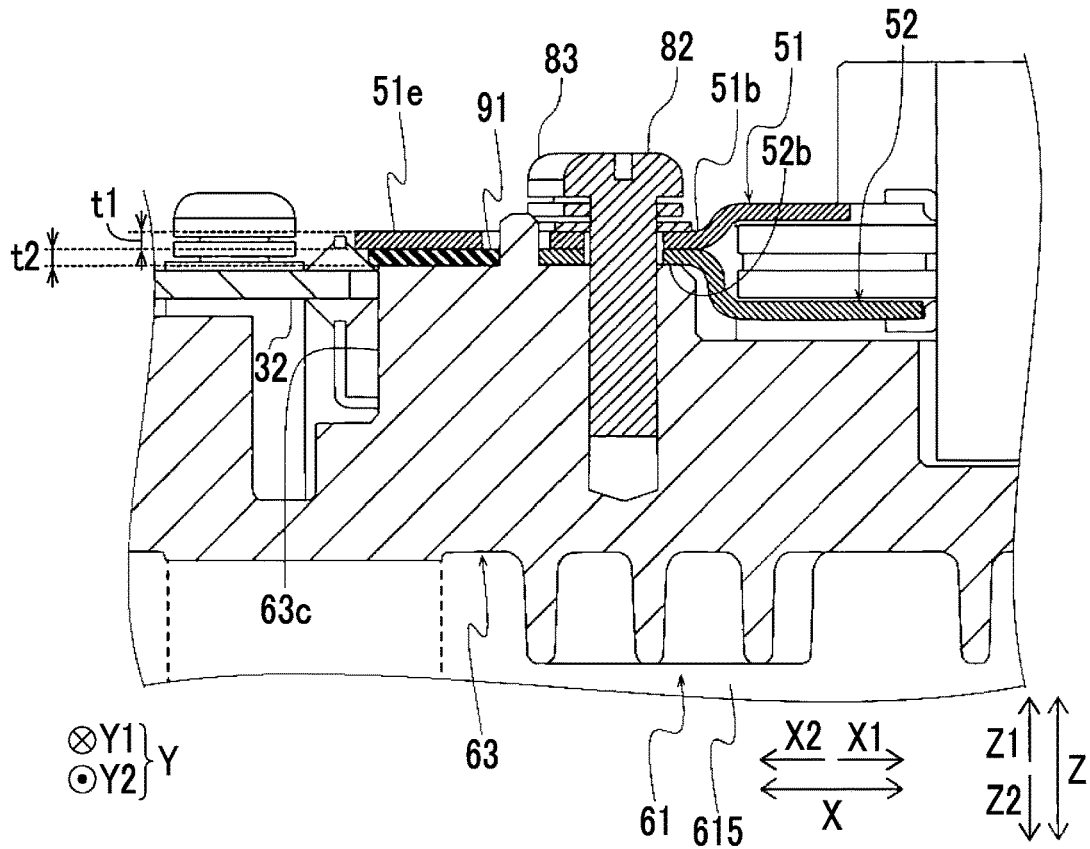
FIG. 16 is a sectional view along line 900-900 of FIG. 9.

In addition, as illustrated in FIG. 16, the extension portion 51*e* of the first bus bar 51 overlaps the protrusion portion 63*c* of the lid portion 63 when viewed from the direction in which the bus bar 50 and the base portion 60 face each other (Z1 direction side or Z2 direction side). Further, an insulating member 91 is disposed between the base portion 60 and the extension portion 51*e*. The extension portion 51*e* extending from the fixed portion 51*c* is configured to dissipate heat to the base portion 60 via the insulating member 91.

The insulating member 91 is an insulating member having a relatively high thermal conductivity. The insulating member 91 is, for example, a thermally conductive heat dissipation material containing silicone. It should be noted that although a thickness t1 of the extension portion 51*e* and a thickness t2 of the insulating member 91 are approximately equal to each other in FIG. 16, the thickness t2 of the insulating member 91 is not limited thereto. The thickness t2 of the insulating member 91 may be appropriately changed depending on the amount of heat required to be dissipated from the first bus bar 51 to the base portion 60 and the thermal conductivity of the insulating member 91. In other words, in a condition that it is possible to sufficiently transfer heat by a desired amount of dissipation from the first bus bar 51 to the base portion 60 for the heat dissipation of the transformer 31*b*, the thickness t2 of the insulating member 91 may be larger or smaller than the thickness t1 of the extension portion 51*e*.

In addition, as described above, by the extension portion 51*e* of the first bus bar 51 extending from the fixed portion 51*c* to the Y2 direction side (see FIG. 13), the extension portion 51*e* overlaps the protrusion portion 63*c* when viewed from the Z1 direction side (see FIG. 16). Further, above the protrusion portion 63*c* (Z1 direction side), the fixed portions 51*b* and 52*b* and the extension portion 51*e* (insulating member 91) are disposed adjacent to each other in the X direction. In the present embodiment, the protrusion portion 63*c* is provided in common with respect to the fixed portions 51*b* and 52*a* (cooling portion side fixed portion 50*b*) and the extension portion 51*e* (insulating member 91). In other words, the heat generated in the transformer 31*b* is dissipated from the fixed portion 51b, the fixed portion 52b, and the extension portion 51e to the common protrusion portion 63c.

Effects of Present Embodiment

The following effects can be obtained in the present embodiment.

In the present embodiment, by fixing the cooling portion side fixed portion 50b (fixed portions 51b and 52b) of the bus bar 50 of the transformer 31b to the base portion 60 provided with the cooling flow path 61, the heat generated in the transformer 31b can be transferred from the cooling portion side fixed portion 50b (fixed portions 51b and 52b) to the cooling liquid flowing through the cooling flow path 61 via the base portion 60 provided with the cooling flow path 61. As a result, the heat generated in the transformer 31b can be efficiently dissipated by the cooling liquid flowing through the cooling flow path 61 to cool the transformer 31b. As a result, it is possible to provide the power conversion device 100 and the DCDC converter unit 30 capable of sufficiently dissipating the heat generated in the transformer 31b from the bus bar 50 of the transformer 31b.

In addition, in the present embodiment, as described above, the cooling portion side fixed portion 50b (fixed portions 51b and 52b) of the bus bar 50 is disposed so as to overlap the cooling flow path 61 provided in the base portion 60 when viewed from the direction in which the bus bar 50 and the base portion 60 face each other (Z2 direction side). As a result, the distance between the cooling portion side fixed portion 50b of the bus bar 50 and the cooling flow path 61 is shorter than a case where the cooling portion side fixed portion 50b (fixed portions 51b and 52b) of the bus bar 50 does not overlap the cooling flow path 61, and thus heat dissipation from the bus bar 50 (cooling of the transformer 31b) can be performed more efficiently. As a result, the heat generated in the transformer 31b can be more sufficiently dissipated from the bus bar 50 of the transformer 31b.

In addition, in the present embodiment, as described above, the cooling portion side fixed portion 50b (fixed portions 51b and 52b) of the bus bar 50 is fixed to the lid portion 63 of the base portion 60. As a result, the heat generated in the transformer 31b can be transferred to the cooling liquid flowing through the cooling flow path 61 via the lid portion 63 of the base portion 60 to which the cooling portion side fixed portion 50b of the bus bar 50 is fixed. As a result, the heat generated in the transformer 31b can be efficiently dissipated to the cooling liquid flowing through the cooling flow path 61 via the lid portion 63 of the base portion 60.

In addition, in the present embodiment, as described above, the lid portion 63 of the base portion 60 has the protrusion portion 63c protruding to the converter substrate 32 side (Z1 direction side). Further, the converter substrate 32 is provided with the opening portion 32a for exposing the protrusion portion 63c of the lid portion 63, and the cooling portion side fixed portion 50b (fixed portions 51b and 52b) of the bus bar 50 is fixed to the protrusion portion 63c of the lid portion 63. As a result, the cooling portion side fixed portion 50b of the bus bar 50 is fixed to the protrusion portion 63c of the lid portion 63 provided on the lid portion 63 of the base portion 60 and protruding to the converter substrate 32 side (Z1 direction side), and thus the distance between the transformer 31b and the lid portion 63 is shorter than a case where the lid portion 63 does not have the protrusion portion 63c protruding to the converter substrate 32 side. As a result, the wiring length of the bus bar 50 of the transformer 31b can be further shortened, and thus heat dissipation from the bus bar 50 (cooling of the transformer 31b) can be performed more effectively. In addition, since the protrusion portion 63c provided on the lid portion 63 of the base portion 60 and protruding to the converter substrate 32 side is exposed by the opening portion 32a of the converter substrate 32, the cooling portion side fixed portion 50b (fixed portions 51b and 52b) can be easily fixed to the protrusion portion 63c via the opening portion 32a even in a case where the cooling portion side fixed portion 50b (fixed portions 51b and 52b) of the bus bar 50 is fixed to the protrusion portion 63c by the screw 82.

In addition, in the present embodiment, as described above, the first bus bar 51 has the extension portion 51e provided so as to extend from the fixed portion 51c so as to overlap the protrusion portion 63c of the lid portion 63 when viewed from the direction in which the bus bar 50 and the base portion 60 face each other (Z2 direction side). Further, the insulating member 91 is disposed between the base portion 60 and the extension portion 51e, and the extension portion 51e extending from the fixed portion 51c is configured to dissipate heat to the base portion 60 via the insulating member 91. As a result, it is possible to dissipate heat to the base portion 60 via the insulating member 91 in the extension portion 51e extending from the fixed portion 51c in addition to the fixed portion 51b, and thus the heat generated in the transformer 31b can be dissipated more efficiently.

In addition, in the present embodiment, as described above, the bus bar 50 is disposed adjacent to the plurality of diode elements 31e in the Y direction in which the plurality of diode elements 31e is adjacent to each other and the X direction intersecting the Z direction in which the bus bar 50 and the base portion 60 face each other. Further, the cooling portion side fixed portion 50b (fixed portions 51b and 52b) of the bus bar 50 is disposed at a position interposed between the plurality of diode elements 31e when viewed from the direction in which the bus bar 50 and the base portion 60 face each other (Z2 direction side). As a result, the bus bar 50 and the plurality of diode elements 31e can be brought closer in the X direction in which the bus bar 50 and the plurality of diode elements 31e are adjacent to each other. As a result, it is possible to suppress an increase in the size of the converter substrate 32 in the X direction in which the bus bar 50 and the plurality of diode elements 31e are adjacent to each other.

In addition, in the present embodiment, as described above, the cooling portion side fixed portion 50b includes the fixed portion 51b of the first bus bar 51 and the fixed portion 52b of the second bus bar 52. Further, the fixed portions 51b and 52b are fixed to the base portion 60 in a state of being in contact with each other at a position overlapping the cooling flow path 61 of the base portion 60 when viewed from the direction in which the bus bar 50 and the base portion 60 face each other (Z1 direction side or Z2 direction side). As a result, the heat generated in the transformer 31b can be dissipated to the cooling flow path 61 via the base portion 60 by each of the fixed portion 51b of the first bus bar 51 and the fixed portion 52b of the second bus bar 52. As a result, the heat generated in the transformer 31b can be dissipated more efficiently. In addition, since the fixed portion 51b and the fixed portion 52b are fixed to the base portion 60 in a state of being in contact with each other, heat can be efficiently transferred from each of the first bus bar 51 and the second bus bar 52 to the base portion 60 as compared with a case where the fixed portion 51b and the fixed portion 52b are fixed to the base portion 60 in a state where a heat transfer member is interposed between the fixed portion 51b and the fixed portion 52b.

In addition, in the present embodiment, as described above, the converter substrate 32 is provided with the connection terminal 35 where the fixed portion 51c of the first bus bar 51 is fastened and fixed, and the first engagement portion A (protrusion portions A1 and A2) engaging with the first bus bar 51 is provided. Further, the first bus bar 51 is provided with the second engagement portion B (hole portion B1 and notch portion B2) engaging with the first engagement portion A. As a result, by engaging the first engagement portion A of the connection terminal 35 and the second engagement portion B of the first bus bar 51 with each other, it is possible to prevent the first bus bar 51 from rotating when the fixed portion 52c of the first bus bar 51 is fastened and fixed to the converter substrate 32. As a result, it is possible to prevent the first bus bar 51 from being distorted due to the first bus bar 51 rotating when the fixed portion 52c of the first bus bar 51 is fastened and fixed to the converter substrate 32.

In addition, in the present embodiment, as described above, the inverter unit 10 is attached to the surface (back surface 60b) of the base portion 60 on the side opposite to the surface where the lid portion 63 is attached. As a result, the heat generated in the inverter unit 10 attached to the surface (back surface 60b) of the base portion 60 on the side opposite to the surface where the lid portion 63 is attached can be transferred to the cooling liquid flowing through the cooling flow path 61 via the base portion 60 provided with the cooling flow path 61. As a result, the heat generated in the inverter unit 10 can be efficiently dissipated to the cooling liquid flowing through the cooling flow path 61 via the base portion 60 provided with the cooling flow path 61.

In addition, in the present embodiment, as described above, the boost converter unit 20 is attached to the surface (front surface 60a) of the base portion 60 on the side where the lid portion 63 is attached. As a result, the heat generated in the boost converter unit 20 attached to the surface (front surface 60a) of the base portion 60 on the side where the lid portion 63 is attached can be transferred to the cooling liquid flowing through the cooling flow path 61 via the base portion 60 provided with the cooling flow path 61. As a result, the heat generated in the boost converter unit 20 can be efficiently dissipated to the cooling liquid flowing through the cooling flow path 61 via the base portion 60 provided with the cooling flow path 61.

In addition, in the present embodiment, as described above, the cooling flow path 615 for cooling the bus bar 50 of the transformer 31b and the cooling flow path 619 for cooling the smoothing reactor 31d are formed in the base portion 60. As a result, the bus bar 50 of the transformer 31b and the smoothing reactor 31d can be cooled by the cooling flow paths 615 and 619, respectively.

Modification Examples

The embodiment disclosed above should be considered to be exemplary and unrestrictive in every respect. The scope of the present invention is shown by the claims rather than the description of the embodiment and further includes every change (modification example) within the meaning and scope equivalent to the claims.

In the example shown in the above embodiment, the cooling flow path 61 is formed such that a cooling liquid flows such that cooling is performed in the order of the boost switching element module 21, the second switching element module 11b, the reactor 22, the converter switching element 31a, the transformer 31b, the resonance reactor 31c, the diode element 31e, the first switching element module 11a, and the smoothing reactor 31d. However, the present invention is not limited thereto. For example, the cooling flow path may be formed such that a cooling liquid flows such that cooling is performed in the order of the smoothing reactor 31d, the first switching element module 11a, the diode element 31e, the resonance reactor 31c, the transformer 31b, the converter switching element 31a, the reactor 22, the second switching element module 11b, and the boost switching element module 21 (direction opposite to the flow illustrated in FIG. 3).

In the example shown in the above embodiment, the cooling portion side fixed portion 50b (fixed portions 51b and 52b) of the bus bar 50 is disposed so as to overlap the cooling flow path 61 provided in the base portion 60 when viewed from the direction in which the bus bar 50 and the base portion 60 (cooling portion) face each other (Z1 direction side or Z2 direction side). However, the present invention is not limited thereto. In the present invention, the cooling portion side fixed portion of the bus bar may be misaligned with respect to the cooling flow path provided in the cooling portion when viewed from the direction in which the bus bar and the cooling portion face each other.

In the example shown in the above embodiment, the cooling portion side fixed portion 50b (fixed portions 51b and 52b) of the bus bar 50 is fixed to the protrusion portion 63c provided on the lid portion 63 (cover member) of the base portion 60 (cooling portion) and protruding to the converter substrate 32 (main circuit board) side. However, the present invention is not limited thereto. In the present invention, the cover member of the cooling portion may be formed in a flat plate shape that is substantially flat and the cooling portion side fixed portion of the bus bar may be fixed to the cover member that is substantially flat and has a flat plate shape.

In the example shown in the above embodiment, the extension portion 51e extending from the fixed portion 51c (substrate side fixed portion) of the first bus bar 51 is configured to dissipate heat to the base portion 60 (cooling portion) via the insulating member 91. However, the present invention is not limited thereto. In the present invention, the first bus bar may be configured to dissipate heat to the cooling portion simply by the first cooling portion side fixed portion without having an extension portion extending from the substrate side fixed portion.

In the example shown in the above embodiment, the cooling portion side fixed portion 50b (fixed portions 51b and 52b) of the bus bar 50 is disposed at a position interposed between the plurality of diode elements 31e when viewed from the direction in which the bus bar 50 and the base portion 60 (cooling portion) face each other (Z2 direction side). However, the present invention is not limited thereto. In the present invention, the cooling portion side fixed portion of the bus bar may be disposed outside the plurality of diodes when viewed from the direction in which the bus bar and the cooling portion face each other.

In the example shown in the above embodiment, the plurality of diode elements 31e is used as a plurality of rectifying elements. However, the present invention is not limited thereto. In the present invention, the plurality of rectifying elements is not limited to diodes insofar as the plurality of rectifying elements is rectifying elements. For example, the element may be a metal oxide semiconductor field effect transistor (MOSFET). In a case where a MOSFET constitutes the element, four MOSFETs may be used for a bridge configuration on the secondary side, that is, a bidirectional DC-DC converter. In addition, the plurality of rectifying elements may be wide bandgap semiconductor elements. The wide bandgap semiconductor element is a semiconductor element larger in bandgap than a silicon semiconductor element and is, for example, a semiconductor element containing SiC, GaN, diamond, a gallium nitride-based material, a gallium oxide-based material, AlN, AlGaN, ZnO, or the like. By using the wide bandgap semiconductor elements for the plurality of rectifying elements, it is possible to improve the speed of switching as compared with a case where a silicon semiconductor element is used.

In the example shown in the above embodiment, the fixed portions 51b and 52b (first cooling portion side fixed portion and second cooling portion side fixed portion) are fixed to the base portion 60 in a state of being in contact with each other at a position overlapping the cooling flow path 61 of the base portion 60 when viewed from the direction in which the bus bar 50 and the base portion 60 (cooling portion) face each other (Z2 direction side). However, the present invention is not limited thereto. In the present invention, a thermally conductive member may be interposed between the first cooling portion side fixed portion and the second cooling portion side fixed portion. In addition, the first cooling portion side fixed portion and the second cooling portion side fixed portion may be fixed to the cooling portion at positions misaligned from each other when viewed from the direction in which the bus bar and the base portion face each other. In addition, the first cooling portion side fixed portion and the second cooling portion side fixed portion may be fixed to different recess portions of the cooling portion (cover member).

In the example shown in the above embodiment, the converter substrate 32 (main circuit board) is provided with the connection terminal 35 provided with the first engagement portion A (protrusion portions A1 and A2) engaging with the first bus bar 51 and the first bus bar 51 is provided with the second engagement portion B (hole portion B1 and notch portion B2) engaging with the first engagement portion A. However, the present invention is not limited thereto. In the present invention, the connection terminal of the main circuit board and the first bus bar may be engagement portion-less. In other words, the first bus bar may be fixed to the connection terminal of the main circuit board simply by a fastening member such as a screw.

In the example shown in the above embodiment, the first bus bar 51 is provided with the hole portion B1 and the notch portion B2 as the second engagement portion B. However, the present invention is not limited thereto. In the present invention, only one of the hole portion and the notch portion may be provided in the first bus bar as the second engagement portion.

What is claimed is:

1. A power conversion device comprising:
a DC-DC converter unit including a transformer having a coil substrate where a primary side coil is formed and a bus bar forming a secondary side coil, and converting a voltage of DC power input from a DC power supply into a different voltage;
a smoothing reactor connected to a secondary side of the transformer; and
a cooling portion having a cooling flow path through which a cooling liquid flows, and the DC-DC converter unit being disposed on the cooling portion, and
a main circuit board to which the bus bar of the transformer is connected, disposed so as to face the cooling portion, wherein the cooling portion has a protrusion portion protruding to the main circuit board side,
the main circuit board is provided with an opening portion for exposing the protrusion portion,
the bus bar of the transformer has a cooling portion side fixed portion fixed to the protrusion portion of the cooling portion provided with the cooling flow path, and
the cooling portion includes a first cooling flow path cooling the bus bar of the transformer, and a second cooling flow path cooling the smoothing reactor.

2. The power conversion device according to claim 1, wherein the cooling portion side fixed portion of the bus bar is disposed so as to overlap the cooling flow path provided in the cooling portion when viewed from a direction in which the bus bar and the cooling portion face each other.

3. The power conversion device according to claim 1, wherein the cooling portion includes a main body member where the cooling flow path is formed, and a cover member attached to the main body member, and
the cooling portion side fixed portion of the bus bar is fixed to the cover member of the cooling portion.

4. The power conversion device according to claim 3, wherein the cover member of the cooling portion has the protrusion portion, and
the cooling portion side fixed portion of the bus bar is fixed to the protrusion portion of the cover member.

5. The power conversion device according to claim 4, wherein the bus bar includes a first bus bar having a substrate side fixed portion fixed to the main circuit board,
the first bus bar has an extension portion provided to extend from the substrate side fixed portion so as to overlap the protrusion portion of the cover member when viewed from a direction in which the bus bar and the cooling portion face each other,
an insulating member is disposed between the cooling portion and the extension portion, and
the extension portion extending from the substrate side fixed portion is configured to dissipate heat to the cooling portion via the insulating member.

6. The power conversion device according to claim 5, wherein the DC-DC converter unit includes a plurality of rectifying elements connected to an output side of the DC-DC converter unit with respect to the transformer and mounted on the main circuit board,
the bus bar is disposed so as to be adjacent to the plurality of rectifying elements in a direction in which the plurality of rectifying elements is adjacent to each other and a direction intersecting the direction in which the bus bar and the cooling portion face each other, and
the cooling portion side fixed portion of the bus bar is disposed at a position interposed between the plurality of rectifying elements when viewed from the direction in which the bus bar and the cooling portion face each other.

7. The power conversion device according to claim 5, wherein the bus bar includes a second bus bar disposed on a side opposite to a side where the first bus bar is disposed with respect to the coil substrate,
the cooling portion side fixed portion includes a first cooling portion side fixed portion of the first bus bar, and a second cooling portion side fixed portion of the second bus bar, and
the first cooling portion side fixed portion and the second cooling portion side fixed portion are fixed to the cooling portion in a state of being in contact with each other at a position overlapping the cooling flow path of the cooling portion when viewed from the direction in which the bus bar and the cooling portion face each other.

8. The power conversion device according to claim 5, wherein the main circuit board is provided with a connection terminal where the substrate side fixed portion of the first bus bar is fastened and fixed, and a first engagement portion engaging with the first bus bar is provided, and the first bus bar is provided with a second engagement portion engaging with the first engagement portion.

9. The power conversion device according to claim 3, further comprising an inverter unit converting DC power input from the DC power supply into AC power and supplying the power to a load, wherein the inverter unit is attached to a surface of the cooling portion on a side opposite to a surface where the cover member is attached.

10. The power conversion device according to claim 9, further comprising a boost converter unit boosting the DC power input from the DC power supply and supplying the power to the inverter unit, wherein the boost converter unit is attached to a surface of the cooling portion on a side where the cover member is attached.

11. A power conversion device comprising:
a DC-DC converter unit including a transformer having a coil substrate where a primary side coil is formed and a bus bar forming a secondary side coil, and converting a voltage of DC power input from a DC power supply into a different voltage; and
a cooling portion where a cooling flow path through which a cooling liquid flows is provided and the DC-DC converter unit is disposed,
wherein the bus bar of the transformer has a cooling portion side fixed portion fixed to the cooling portion provided with the cooling flow path,
the DC-DC converter unit further includes a smoothing reactor connected to a secondary side of the transformer, and
the cooling portion includes a first cooling flow path cooling the bus bar of the transformer and a second cooling flow path cooling the smoothing reactor.

12. A DC-DC converter device comprising:
a DC-DC converter element including a transformer having a coil substrate where a primary side coil is formed and a bus bar forming a secondary side coil, and converting a voltage of DC power input from a DC power supply into a different voltage;
a smoothing reactor connected to a secondary side of the transformer; and
a main circuit board to which the bus bar of the transformer is connected, disposed so as to face a cooling portion provided with a cooling flow path, wherein
the cooling portion has a protrusion portion protruding to the main circuit board side,
the main circuit board is provided with an opening portion for exposing the protrusion portion, and
the bus bar of the transformer has a cooling portion side fixed portion fixed to the protrusion portion of the cooling portion provided with the cooling flow path, and
the cooling portion includes a first cooling flow path cooling the bus bar of the transformer, and a second cooling flow path cooling the smoothing reactor.

13. The DC-DC converter device according to claim 12, wherein the cooling portion includes a main body member where the cooling flow path is formed and a cover member attached to the main body member, and
the cooling portion side fixed portion of the bus bar is fixed to the cover member of the cooling portion.

14. A DC-DC converter device comprising:
a DC-DC converter element including a transformer having a coil substrate where a primary side coil is formed and a bus bar forming a secondary side coil, and converting a voltage of DC power input from a DC power supply into a different voltage,
wherein the bus bar of the transformer has a cooling portion side fixed portion fixed to a cooling portion provided with a cooling flow path, and
the DC-DC converter further comprises
a smoothing reactor connected to a secondary side of the transformer,
wherein cooling portion includes a first cooling flow path cooling the bus bar of the transformer, and a second cooling flow path cooling the smoothing reactor.

* * * * *